(12) United States Patent
Kim

(10) Patent No.: US 11,763,862 B2
(45) Date of Patent: Sep. 19, 2023

(54) ELECTRONIC DEVICE FOR PERFORMING READ OPERATION USING PIPE CIRCUIT

(71) Applicant: SK hynix Inc., Icheon-si Gyeonggi-do (KR)

(72) Inventor: Kwang Soon Kim, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 99 days.

(21) Appl. No.: 17/375,400

(22) Filed: Jul. 14, 2021

(65) Prior Publication Data

US 2022/0319562 A1 Oct. 6, 2022

(30) Foreign Application Priority Data

Mar. 31, 2021 (KR) ........................ 10-2021-0042378

(51) Int. Cl.
  *G11C 7/12* (2006.01)
  *G11C 7/10* (2006.01)
(52) U.S. Cl.
  CPC ................ *G11C 7/12* (2013.01); *G11C 7/106* (2013.01); *G11C 7/1048* (2013.01)
(58) Field of Classification Search
  CPC .......... G11C 7/12; G11C 7/1048; G11C 7/106
  USPC ............................................. 365/203, 185.25
  See application file for complete search history.

(56) References Cited

U.S. PATENT DOCUMENTS

| 9,659,615 | B1 * | 5/2017 | Kwak | ........................ | G11C 7/12 |
| 9,953,688 | B1 * | 4/2018 | Min | ........................ | G11C 7/12 |
| 10,734,042 | B2 * | 8/2020 | Kim | ........................ | G11C 7/109 |
| 11,423,962 | B1 * | 8/2022 | Yeh | ........................ | G11C 11/419 |

FOREIGN PATENT DOCUMENTS

| KR | 1020080092681 A | 10/2008 |
| KR | 1020200033691 A | 3/2020 |

\* cited by examiner

*Primary Examiner* — Connie C Yoha
(74) *Attorney, Agent, or Firm* — WILLIAM PARK & ASSOCIATES LTD.

(57) ABSTRACT

An electronic device includes a pre-charge control circuit configured to generate first and second pre-charge signals with pulses that are selectively generated based on a first and second output control signals that are generated during a read operation, and a data processing circuit configured to pre-charge one of first and second internal nodes based on the first and second pre-charge signals, latch internal data based on first and second input control signals, and output data that is generated from the latched internal data to an external device based on the first and second output control signals. The data is generated from the internal data that is transmitted through one of the first and second internal nodes.

21 Claims, 21 Drawing Sheets

ELECTRONIC DEVICE FOR PERFORMING READ OPERATION USING PIPE CIRCUIT

CROSS-REFERENCE TO RELATED APPLICATIONS

The present application claims priority under 35 U.S.C. 119(a) to Korean Patent Application No. 10-2021-0042378, filed on Mar. 31, 2021, which is incorporated herein by reference in its entirety.

BACKGROUND

1. Technical Field

Embodiments of the present disclosure relate to electronic devices for selectively pre-charging internal nodes connected to pipe circuits to perform a read operation.

2. Related Art

In general, semiconductor memory devices with double data rate synchronous DRAM (DDR SDRAM) read and write data according to a command input from an external chip set. In order for a semiconductor memory device to perform such read and write operations, various circuits are provided therein, and among them, there is a pipe circuit for efficiently controlling more data. In general, a pipe circuit is a circuit configured to store each of a plurality of input signals at a desired timing and output each at a desired timing, and is included in the semiconductor memory device. The pipe circuit may increase the capacity of signal transmission/reception between internal circuits of the semiconductor memory device, or between an external device and an internal circuit of the semiconductor memory device.

SUMMARY

According to an embodiment of the present invention, there is provided an electronic device with a pre-charge control circuit configured to generate first and second pre-charge signals with pulses that are selectively generated based on a first and second output control signals that are generated during a read operation, and a data processing circuit configured to pre-charge one of first and second internal nodes based on the first and second pre-charge signals, latch internal data based on first and second input control signals, and output data that is generated from the latched internal data to an external device based on the first and second output control signals, the data being generated from the internal data that is transmitted through one of the first and second internal nodes.

In addition, according to another embodiment of the present invention, there is provided an electronic device with a pipe control circuit configured to generate first and second input control signals with pulses that are sequentially generated according to a pulse of a column pulse, and generate first and second output control signals with pulses that are sequentially generated according to a pulse of a column shifting pulse, a pre-charge control circuit configured to generate a first pre-charge signal with a pulse that is generated based on the second output control signal after generating a second pre-charge signal with a pulse that is generated based on the first output control signal, and a data processing circuit configured to pre-charge a second internal node based on a pulse of the second pre-charge signal, pre-charge a first internal node based on a pulse of the first pre-charge signal after generating first data from first internal data based on the first input control signal and the first output control signal, and generate second data from second internal data based on the second input control signal and the second output control signal.

In addition, according to another embodiment of the present invention, there is provided an electronic device including a pre-charge control circuit configured to generate a plurality of pre-charge signals based on a plurality of output control signals with pulses that are selectively generated during a read operation, and a data processing circuit configured to include a plurality of pipe circuits, pre-charge a plurality of internal nodes connected to the plurality of pipe circuits based on the plurality of pre-charge signals, the plurality of pipe circuits outputting internal data to one of the plurality of internal nodes based on the plurality of input control signals and the plurality of output control signals, and generate data according to logic levels of the plurality of internal nodes to output the generated data to an external device.

DETAILED DESCRIPTION OF THE EMBODIMENTS

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal with a logic "high" level may be distinguished from a signal with a logic "low" level. For example, when a signal with a first voltage correspond to a signal with a logic "high" level, a signal with a second voltage correspond to a signal with a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal with a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
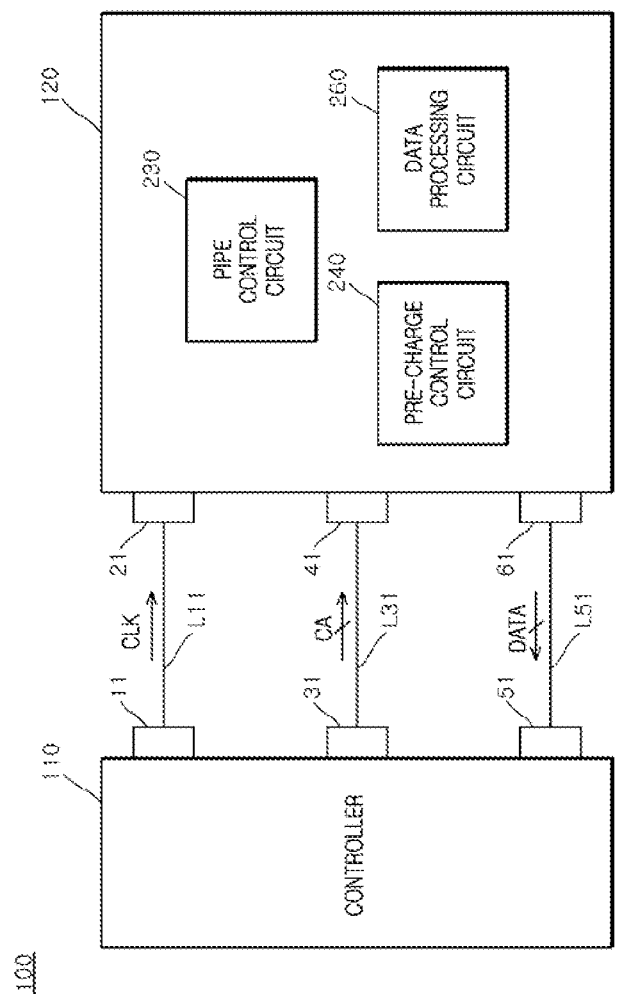
FIG. 1 is a block diagram illustrating a configuration of an electronic system according to an embodiment of the present disclosure.

FIG. 1 is a block diagram illustrating a configuration of an electronic system 100 according to an embodiment of the present disclosure. As illustrated in FIG. 1, the electronic system 100 according to an embodiment of the present disclosure may include a controller 110 and an electronic device 120. The electronic device 120 may include a pipe control circuit 230, a pre-charge control circuit 240, and a data processing circuit 260.

The controller 110 may include a first control pin 11, a second control pin 31, and a third control pin 51. The electronic device 120 may include a first semiconductor pin 21, a second semiconductor pin 41, and a third semiconductor pin 61. A first transmission line L11 may be connected to the first control pin 11 and the first semiconductor pin 21. A second transmission line L31 may be connected to the second control pin 31 and the second semiconductor pin 41. A third transmission pin L51 may be connected to the third control pin 51 and the third semiconductor pin 61. The controller 110 may transmit a clock CLK to the electronic device 120 through the first transmission line L11 to control the electronic device 120. The controller 110 may transmit a command address CA to the electronic device 120 through the second transmission line L31 to control the electronic device 120. The controller 110 may receive data from the electronic device 120 through the third transmission line L51. The controller 110 may output the clock CLK and the command address CA for performing a read operation to the electronic device 120. The command address CA may be continuously output in synchronization with an odd pulse or an even pulse included in the clock CLK.

The pipe control circuit 230 may generate first to fourth input control signals (PIN<1:4> of FIG. 2) that are sequentially enabled during a read operation based on a command address CA that is input in synchronization with a clock CLK. The pipe control circuit 230 may generate first to fourth output control signals (POUT<1:4> of FIG. 2) that are sequentially enabled during the read operation based on the command address CA that is input in synchronization with the clock CLK.

Figure 2:
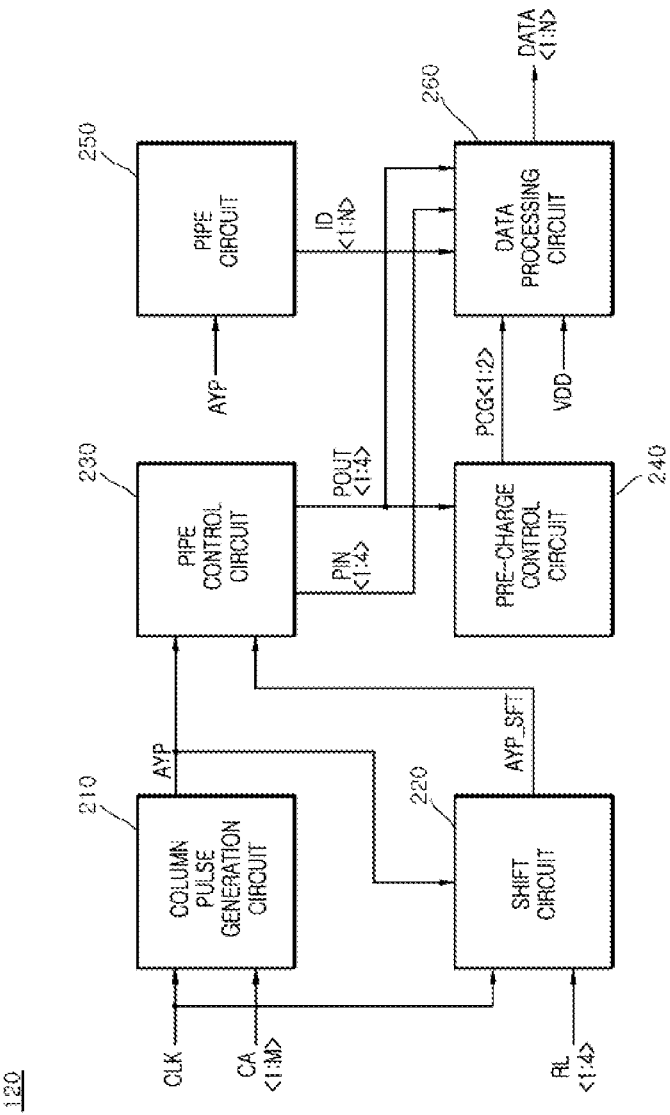
FIG. 2 is a block diagram illustrating a configuration of an electronic device included in the electronic system illustrated in FIG. 1.

The pre-charge control circuit 240 may generate first and second pre-charge signals (PCG<1:2> of FIG. 2) that include pulses that are selectively generated based on the first to fourth output control signals (POUT<1:4> in FIG. 2).

The data processing circuit 260 may pre-charge one of first and second internal nodes (ND21, ND22 of FIG. 8) based on the first and second pre-charge signals (PCG<1:2> of FIG. 2). The data processing circuit 260 may latch internal data (ID<1:N> of FIG. 2) based on the first to fourth input control signals (PIN<1:4> of FIG. 2). The data processing circuit 260 may generate data DATA from the latched internal data (ID<1:N> of FIG. 2) based on the first to fourth output control signals (POUT<1:4> in FIG. 2).

FIG. 2 is a block diagram illustrating a configuration of the electronic device 120 included in the electronic system illustrated in FIG. 1. As illustrated in FIG. 2, the electronic device 120 may include a column pulse generation circuit 210, a shift circuit 220, a pipe control circuit 230, a pre-charge control circuit 240, a core circuit 250, and a data processing circuit 260.

The column pulse generation circuit 210 may generate a column pulse AYP, based on a command address CA<1:M> in synchronization with a clock CLK. The column pulse generation circuit 210 may generate the column pulse AYP with a pulse that is generated when the command address CA<1:M> that is input in synchronization with the clock CLK is a combination of logic levels for performing a read operation. The column pulse generation circuit 210 may generate the column pulse AYP with a pulse that is generated based on decoding the command address CA<1:M> that is input in synchronization with the clock CLK. The number M of bits of the command address CA<1:M> may be set to various numbers according to embodiments.

The shift circuit 220 may generate a column shifting pulse AYP_SFT by delaying the column pulse AYP by a latency period in synchronization with the clock CLK. The shift circuit 220 may generate the column shifting pulse AYP_SFT by delaying the column pulse AYP with a delay amount that is adjusted based on first to fourth latency signals RL<1:4> in synchronization with the clock CLK. The latency period may be set to a period for outputting the first to $N^{th}$ internal data ID<1:N> from a time when the first to $M^{th}$ command addresses CA<1:M> are input. The first to fourth latency signals RL<1:4> may be set to signals for setting the latency period. The number 4 of bits of the first to fourth latency signals RL<1:4> may be variously set according to embodiments.

The pipe control circuit 230 may generate the first to fourth input control signals PIN<1:4> with pulses that are sequentially generated according to the column pulse AYP. The pipe control circuit 230 may generate the first to fourth input control signals PIN<1:4> with pulses that are sequentially generated each time a pulse of the column pulse AYP is input. For example, the pipe control circuit 230 may generate the first input control signal PIN<1> with a pulse that is generated when the pulse of the column pulse AYP is input once. For example, the pipe control circuit 230 may generate the second input control signal PIN<2> with a pulse that is generated when the pulse of the column pulse AYP is input twice. The pipe control circuit 230 may generate the first input control signal PIN<1> with a pulse that is generated when the pulse of the column pulse AYP is input after the pulse of the fourth input control signal PIN<4> is generated.

The pipe control circuit 230 may generate the first to fourth output control signals POUT<1:4> with pulses that are sequentially generated according to the column shifting pulse AYP_SFT. The pipe control circuit 230 may generate the first to fourth output control signals POUT<1:4> with pulses that are sequentially generated each time a pulse of the column shifting pulse AYP_SFT is input. For example, the pipe control circuit 230 may generate the first output control signal POUT<1> with a pulse that is generated when the pulse of the column shifting pulse AYP_SFT is input once. The pipe control circuit 230 may generate the second output control signal POUT<2> with a pulse that is generated when the pulse of the column shifting pulse AYP_SFT is input twice. The pipe control circuit 230 may generate the first output control signal POUT<1> with a pulse that is generated when the pulse of the column shifting pulse AYP_SFT is input after the pulse of the fourth output control signal POUT<4> is generated.

The pre-charge control circuit 240 may generate the first and second pre-charge signals PCG<1:2> with pulses that are selectively generated based on the first to fourth output control signals POUT<1:4>. The pre-charge control circuit 240 may generate the first pre-charge signal PCG<1> with a pulse that is generated based on the third and fourth output control signals POUT<3:4>. The pre-charge control circuit 240 may generate the second pre-charge signal PCG<2> with a pulse that is generated based on the first and second output control signals POUT<1:2>.

The core circuit 250 may be implemented with a general memory circuit with a plurality of memory cells (not illustrated). The core circuit 250 may output the internal data ID<1:N> stored therein based on the pulse of the column pulse AYP. The core circuit 250 may be implemented to output the internal data ID<1:N> during a read operation, but may be implemented to store the internal data ID<1:N> during a write operation. The number N of bits of the internal data ID<1:N> may be set to various numbers according to embodiments.

The data processing circuit 260 may pre-charge one of the first and second internal nodes (ND1 and ND2 of FIG. 8) based on the first and second pre-charge signals PCG<1:2>. The data processing circuit 260 may pre-charge one of the first and second internal nodes (ND1 and ND2 of FIG. 8) to a power voltage VDD level based on the first and second pre-charge signals PCG<1:2>. The data processing circuit 260 may latch the internal data ID<1:N> based on the first to fourth input control signals PIN<1:4>. The data processing circuit 260 may generate data DATA<1:N> from the latched internal data ID<1:N> based on the first to fourth output control signals POUT<1:4>. The data processing circuit 260 may output the DATA<1:N> to the controller 110. The number N of bits of the data DATA<1:N> may be set to various numbers according to embodiments. The numbers of bits of the internal data ID<1:N> and the data DATA<1:N> may be set to the same number N.

Figure 3:
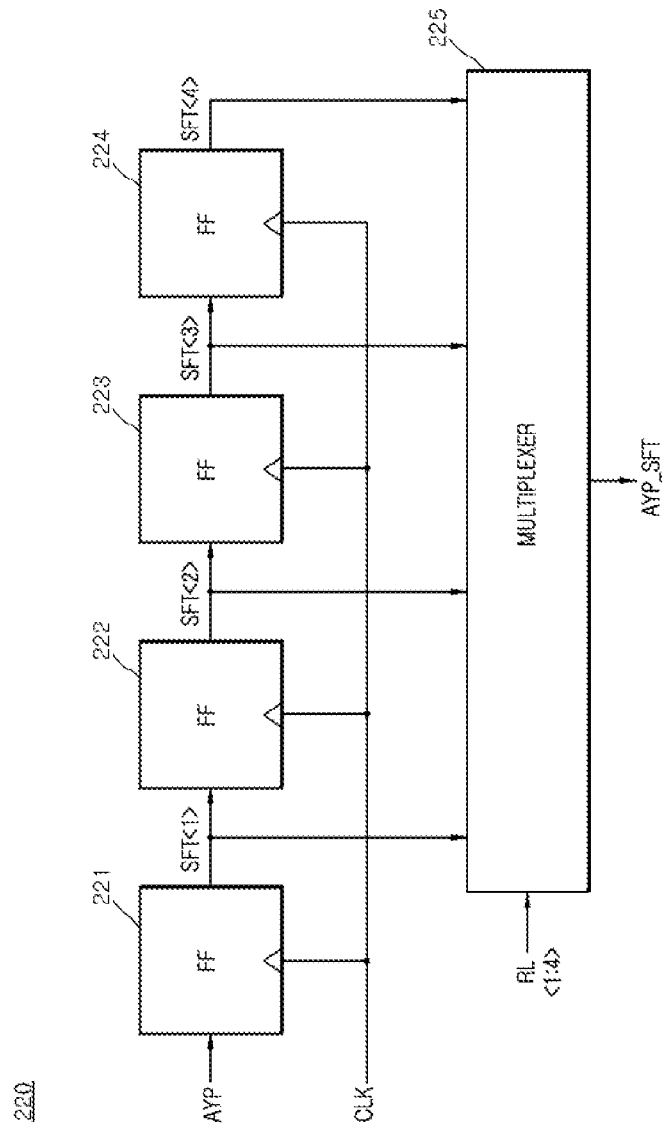
FIG. 3 is a block diagram illustrating a configuration of a shift circuit included in the electronic device illustrated in FIG. 2.

FIG. 3 is a circuit diagram illustrating a configuration of the shift circuit 220 included in the electronic device illustrated in FIG. 2. The shift circuit 220 may include a first shifting signal generation circuit 221, a second shifting signal generation circuit 222, a third shifting signal generation circuit 223, a fourth shifting signal generation circuit 224, and a multiplexer 225.

The first shifting signal generation circuit 221 may be implemented with a flip flop. The first shifting signal generation circuit 221 may delay the column pulse AYP by one period of the clock CLK to generate a first shifting signal SFT<1>.

The second shifting signal generation circuit 222 may be implemented with a flip flop. The second shifting signal generation circuit 222 may delay the first shifting signal SFT<1> by one period of the clock CLK to generate a second shifting signal SFT<2>.

The third shifting signal generation circuit 223 may be implemented with a flip flop. The third shifting signal generation circuit 223 may delay the second shifting signal SFT<2> by one period of the clock CLK to generate a third shifting signal SFT<3>.

The fourth shifting signal generation circuit 224 may be implemented with a flip flop. The fourth shifting signal generation circuit 222 may delay the third shifting signal SFT<3> by one period of the clock CLK to generate a fourth shifting signal SFT<4>.

The multiplexer 225 may output one of the first to fourth shifting signals SFT<1:4> as the column shifting pulse AYP_SFT according to the logic level combinations of the first to fourth latency signals RL<1:4>. The multiplexer 225 may output the first shifting signal SFT<1> as the column shifting pulse AYP_SFT when the first latency signal RL<1> is input at a logic "high" level. The multiplexer 225 may output the second shifting signal SFT<2> as the column shifting pulse AYP_SFT when the second latency signal RL<2> is input at a logic "high" level. The multiplexer 225 may output the third shifting signal SFT<3> as the column shifting pulse AYP_SFT when the third latency signal RL<3> is input at a logic "high" level. The multiplexer 225 may output the fourth shifting signal SFT<4> as the column shifting pulse AYP_SFT when the fourth latency signal RL<4> is input at a logic "high" level. In this embodiment, the number of bits of the first to fourth latency signals RL<1:4> is set to 4, but may be set to various numbers to set various the latency period.

Figure 4:
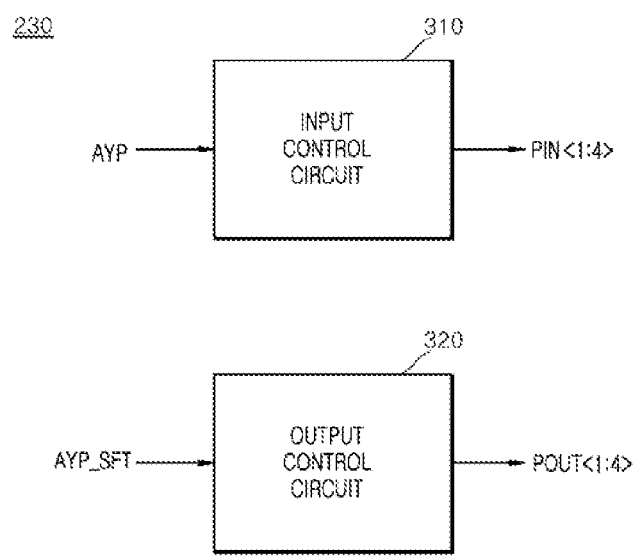
FIG. 4 is a block diagram illustrating a configuration of a pipe control circuit included in the electronic device illustrated in FIG. 2.

FIG. 4 is a circuit diagram illustrating a configuration of the pipe control circuit 230 included in the electronic device illustrated in FIG. 2. As illustrated in FIG. 4, the pipe control circuit 230 may include an input control circuit 310 and an output control circuit 320.

The input control circuit 310 may generate first to fourth input control signals PIN<1:4> with pulses that are sequentially generated according to the pulse of the column pulse AYP. The input control circuit 310 may generate the first input control signal PIN<1> with a pulse that is generated when the pulse of the column pulse AYP is input once. The input control circuit 310 may generate the second input control signal PIN<2> with a pulse that is generated when the pulse of the column pulse AYP is input twice. The input control circuit 310 may generate the third input control signal PIN<3> with a pulse that is generated when the pulse of the column pulse AYP is input three times. The input control circuit 310 may generate the fourth input control signal PIN<4> with a pulse that is generated when the pulse of the column pulse AYP is input four times. The input control circuit 310 may generate the first input control signal PIN<1> with a pulse that is generated when the pulse of the column pulse AYP is input five times.

The output control circuit 320 may generate first to fourth output control signals POUT<1:4> with pulses that are sequentially generated according to the pulse of the column shifting pulse AYP_SFT. The output control circuit 320 may generate the first output control signal POUT<1> with a pulse that is generated when the pulse of the column shifting pulse AYP_SFT is input once. The output control circuit 320 may generate the second output control signal POUT<2> with a pulse that is generated when the pulse of the column shifting pulse AYP_SFT is input twice. The output control circuit 320 may generate the third output control signal POUT<3> with a pulse that is generated when the pulse of the column shifting pulse AYP_SFT is input three times. The output control circuit 320 may generate the fourth output control signal POUT<4> with a pulse that is generated when the pulse of the column shifting pulse AYP_SFT is input four times. The output control circuit 320 may generate the first output control signal POUT<1> with a pulse that is generated when the pulse of the column shifting pulse AYP_SFT is input five times.

Figure 5:
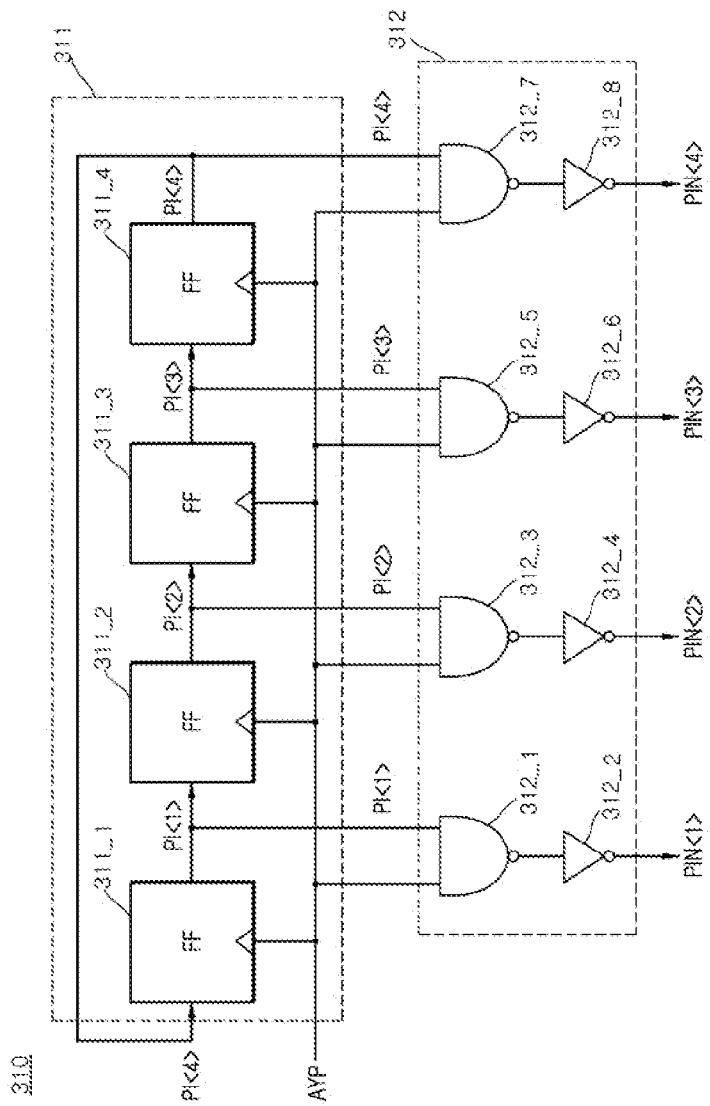
FIG. 5 a diagram illustrating a configuration of an input control circuit included in the pipe control circuit illustrated in FIG. 4.

FIG. 5 a diagram illustrating a configuration of the input control circuit 310 included in the pipe control circuit illustrated in FIG. 4. The input control circuit 310 may include a pre-input signal generation circuit 311 and an input control signal generation circuit 312.

The pre-input signal generation circuit 311 may include flip flops 311_1, 311_2, 311_3, and 311_4 connected in series to each other. The flip flop 311_1 may output a fourth pre-input signal PI<4> as a first pre-input signal PI<1> when a pulse of the column pulse AYP is input. The flip flop 311_2 may output the first pre-input signal PI<1> as a second pre-input signal PI<2> when a pulse of the column pulse AYP is input. The flip flop 311_3 may output the second pre-input signal PI<2> as a third pre-input signal PI<3> when a pulse of the column pulse AYP is input. The flip flop 311_4 may output the third pre-input signal PI<3> as the fourth pre-input signal PI<4> when a pulse of the column pulse AYP is input. Among the first to fourth pre-input signals PI<1:4>, the fourth pre-input signal PI<4> may be generated at a logic "high" level during an initialization operation.

The pre-input signal generation circuit 311 may generate the first to fourth pre-input signals PI<1:4> that are sequentially enabled each time the pulse of the column pulse AYP is input.

The input control signal generation circuit 312 may be implemented with NAND gates 312_1, 312_3, 312_5, and 312_7 and inverters 312_2, 312_4, 312_6, and 312_8.

The NAND gate 312_1 and the inverter 312_2 may perform a multiplication operation for the first pre-input signal PI<1> and the column pulse AYP to generate the first input control signal PIN<1>. The NAND gate 312_1 and the inverter 312_2 may generate the first input control signal PIN<1> with a pulse that is generated when the pulse of the column pulse AYP is input during the period in which the first pre-input signal PI<1> is input at a logic "high" level.

The NAND gate 312_3 and the inverter 312_4 may perform a multiplication operation for the second pre-input signal PI<2> and the column pulse AYP to generate the second input control signal PIN<2>. The NAND gate 312_3 and the inverter 312_4 may generate the second input control signal PIN<2> with a pulse that is generated when the pulse of the column pulse AYP is input during the period in which the second pre-input signal PI<2> is input at a logic "high" level.

The NAND gate 312_5 and the inverter 312_6 may perform a multiplication operation for the third pre-input signal PI<3> and the column pulse AYP to generate the third input control signal PIN<3>. The NAND gate 312_5 and the inverter 312_6 may generate the third input control signal PIN<3> with a pulse that is generated when the pulse of the column pulse AYP is input during the period in which the third pre-input signal PI<3> is input at a logic "high" level.

The NAND gate 312_7 and the inverter 312_8 may perform a multiplication operation for the fourth pre-input signal PI<4> and the column pulse AYP to generate the fourth input control signal PIN<4>. The NAND gate 312_7 and the inverter 312_8 may generate the fourth input control signal PIN<4> with a pulse that is generated when the pulse of the column pulse AYP is input during the period in which the fourth pre-input signal PI<4> is input at a logic "high" level.

The input control signal generation circuit 312 may generate the first to fourth input control signals PIN<1:4> with the pulses that are sequentially generated each time the pulse of the column pulse AYP is input.

Figure 6:
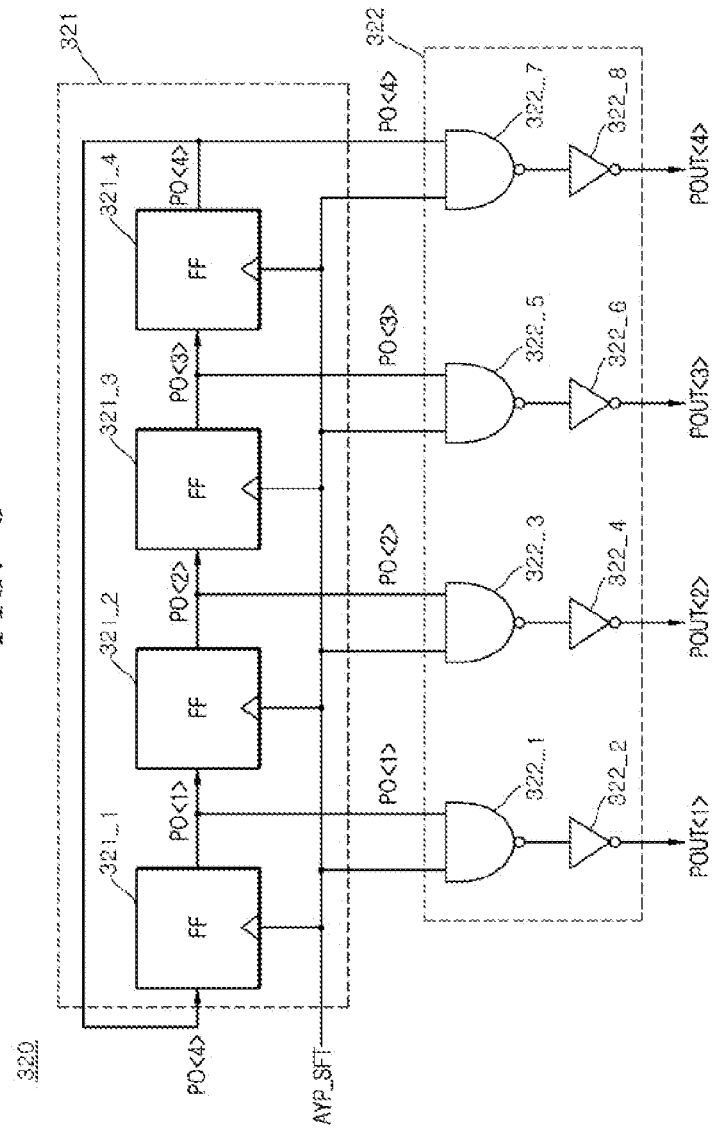
FIG. 6 a diagram illustrating a configuration of an output control circuit included in the pipe control circuit illustrated in FIG. 4.

FIG. 6 a diagram illustrating a configuration of the output control circuit 320 included in the pipe control circuit illustrated in FIG. 4. As illustrated in FIG. 6, the output control circuit 320 may include a pre-output signal generation circuit 321 and an output control signal generation circuit 322.

The pre-output signal generation circuit 321 may include flip flops 321_1, 321_2, 321_3, and 321_4 that are connected in series to each other. The flip flop 321_1 may output a fourth pre-output signal PO<4> as a first pre-output signal PO<1> when a pulse of the column shifting pulse AYP_SFT is input. The flip flop 321_2 may output the first pre-output signal PO<1> as a second pre-output signal PO<2> when a pulse of the column shifting pulse AYP_SFT is input. The flip flop 321_3 may output the second pre-output signal PO<2> as a third pre-output signal PO<3> when a pulse of the column shifting pulse AYP_SFT is input. The flip flop 321_4 may output the third pre-output signal PO<3> as a fourth pre-output signal PO<4> when a pulse of the column shifting pulse AYP_SFT is input. Among the first to fourth pre-output signals PO<1:4>, the fourth pre-output signal PO<4> may be generated at a logic "high" level during an initialization operation.

The pre-output signal generation circuit 321 may generate the first to fourth pre-output signals PO<1:4> that are sequentially enabled each time the pulse of the column shifting pulse AYP_SFT is input.

The output control signal generation circuit 322 may be implemented with NAND gates 322_1, 322_3, 322_5, and 322_7 and inverters 322_2, 322_4, 322_6, and 322_8.

The NAND gate 322_1 and the inverter 322_2 may perform a multiplication operation for the first pre-output signal PO<1> and the column shifting pulse AYP_SFT to generate a first output control signal POUT<1>. The NAND gate 322_1 and the inverter 322_2 may generate the first output control signal POUT<1> with a pulse that is generated when the pulse of the column shifting pulse AYP_SFT is input during the period in which the first pre-output signal PO<1> is input at a logic "high" level.

The NAND gate 322_3 and the inverter 322_4 may perform a multiplication operation for the second pre-output signal PO<2> and the column shifting pulse AYP_SFT to generate a second output control signal POUT<2>. The NAND gate 322_3 and the inverter 322_4 may generate the second output control signal POUT<2> with a pulse that is generated when the pulse of the column shifting pulse AYP_SFT is input during the period in which the second pre-output signal PO<2> is input at a logic "high" level.

The NAND gate 322_5 and the inverter 322_6 may perform a multiplication operation for the third pre-output signal PO<3> and the column shifting pulse AYP_SFT to generate a third output control signal POUT<3>. The NAND gate 322_5 and the inverter 322_6 may generate the third output control signal POUT<3> with a pulse that is generated when the pulse of the column shifting pulse AYP_SFT is input during the period in which the third pre-output signal PO<3> is input at a logic "high" level.

The NAND gate 322_7 and the inverter 322_8 may perform a multiplication operation for the fourth pre-output signal PO<4> and the column shifting pulse AYP_SFT to generate a fourth output control signal POUT<4>. The NAND gate 322_7 and the inverter 322_8 may generate the fourth output control signal POUT<4> with a pulse that is generated when the pulse of the column shifting pulse AYP_SFT is input during the period in which the fourth pre-output signal PO<4> is input at a logic "high" level.

The output control signal generation circuit 322 may generate the first to fourth output control signals POUT<1:4> with the pulses that are sequentially generated each time the pulse of the column shifting pulse AYP_SFT is input.

Figure 7:
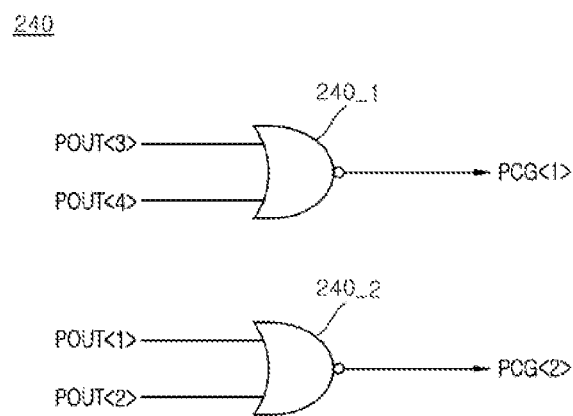
FIG. 7 is a circuit diagram illustrating a configuration of a pre-charge control circuit included in the electronic device illustrated in FIG. 2.

FIG. 7 is a circuit diagram illustrating a configuration of a pre-charge control circuit 240 included in the electronic device illustrated in FIG. 2. As illustrated in FIG. 7, the pre-charge control circuit 240 may be implemented with NOR gates 240_1 and 240_2.

The NOR gate 240_1 may perform a NOR operation for the third output control signal POUT<3> and the fourth output control signal POUT<4> to generate a first pre-charge signal PCG<1>. The NOR gate 240_1 may generate the first pre-charge signal PCG<1> of a logic "low" level when one of the third output control signal POUT<3> and the fourth output control signal POUT<4> is input at a logic "high" level. The NOR gate 240_1 may generate the first pre-charge signal PCG<1> of a logic "high" level when both the third output control signal POUT<3> and the fourth output control signal POUT<4> are input at logic "low" levels.

The NOR gate 240_2 may perform a NOR operation for the first output control signal POUT<1> and the second output control signal POUT<2> to generate a second pre-charge signal PCG<2>. The NOR gate 240_2 may generate the second pre-charge signal PCG<2> of a logic "low" level when one of the first output control signal POUT<1> and the second output control signal POUT<2> is input at a logic "high" level. The NOR gate 240_2 may generate the second pre-charge signal PCG<2> of a logic "high" level when both the first output control signal POUT<1> and the second output control signal POUT<2> are input at logic "low" levels.

Figure 8:
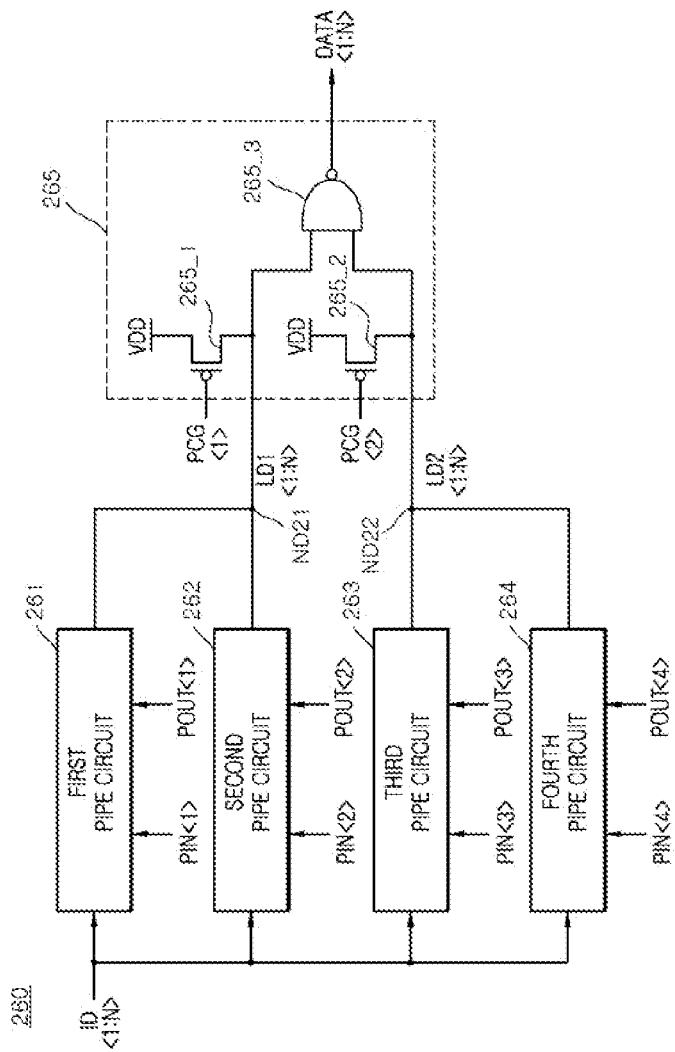
FIG. 8 is a diagram illustrating a configuration of a data processing circuit included in the electronic device illustrated in FIG. 2.

FIG. 8 is a diagram illustrating a configuration of a data processing circuit 260 included in the electronic device illustrated in FIG. 2. As illustrated in FIG. 8, the data processing circuit 260 may include a first pipe circuit 261, a second pipe circuit 262, a third pipe circuit 263, a fourth pipe circuit 264, and a data output circuit 265.

The first pipe circuit 261 may latch the internal data ID<1:N> based on a pulse of the first input control signal PIN<1>. The first pipe circuit 261 may output the latched internal data ID<1:N> based on a pulse of the first output control signal POUT<1> to a first internal node ND21. The internal data ID<1:N> loaded on the first internal node ND21 may be set as first latch data LD1<1:N>.

The second pipe circuit 262 may latch the internal data ID<1:N> based on a pulse of the second input control signal PIN<2>. The second pipe circuit 262 may output the latched internal data ID<1:N> based on a pulse of the second output control signal POUT<2> to the first internal node ND21. The internal data ID<1:N> loaded on the first internal node ND21 may be set as the first latch data LD1<1:N>.

The third pipe circuit 263 may latch the internal data ID<1:N> based on a pulse of the third input control signal PIN<3>. The third pipe circuit 263 may output the latched internal data ID<1:N> based on a pulse of the third output control signal POUT<3> to a second internal node ND22. The internal data ID<1:N> loaded on the second internal node ND22 may be set as second latch data LD2<1:N>.

The fourth pipe circuit 264 may latch the internal data ID<1:N> based on a pulse of the fourth input control signal PIN<4>. The fourth pipe circuit 264 may output the latched internal data ID<1:N> based on a pulse of the fourth output control signal POUT<4> to the second internal node ND22. The internal data ID<1:N> loaded on the second internal node ND22 may be set as the second latch data LD2<1:N>.

The data output circuit 265 may be implemented with a first pre-charge device 265_1, a second pre-charge device 265_2, and a logic device 265_3.

The first pre-charge device 265_1 may be implemented with a PMOS transistor disposed between the power voltage VDD and the first internal node ND21. The first pre-charge device 265_1 may be turned-on when the first pre-charge signal PCG<1> is input at a logic "low" level to pre-charge the first internal node ND21 to the power voltage VDD level. The first pre-charge device 265_1 may be turned-off when the first pre-charge signal PCG<1> is input at a logic "high" level.

The second pre-charge device 265_2 may be implemented with a PMOS transistor disposed between the power voltage VDD and the second internal node ND22. The second pre-charge device 265_2 may be turned-on when the second pre-charge signal PCG<2> is input at a logic "low" level to pre-charge the second internal node ND22 to the power voltage VDD level. The second pre-charge device 265_2 may be turned-off when the second pre-charge signal PCG<2> is input at a logic "high" level.

The logic device 265_3 may be implemented with a NAND gate. The logic device 265_3 may generate data DATA<1:N> according to logic levels of the first internal node ND21 and the second internal node ND22. The logic device 265_3 may inversely buffer the second latch data LD2<1:N> loaded on the second internal node ND22 to generate the data DATA<1:N> when the first internal node ND21 is pre-charged to the power voltage VDD level. The logic device 265_3 may inversely buffer the first latch data LD1<1:N> loaded on the first internal node ND21 to output the data DATA<1:N> when the second internal node ND22 is pre-charged to the power voltage VDD level.

Figure 9:
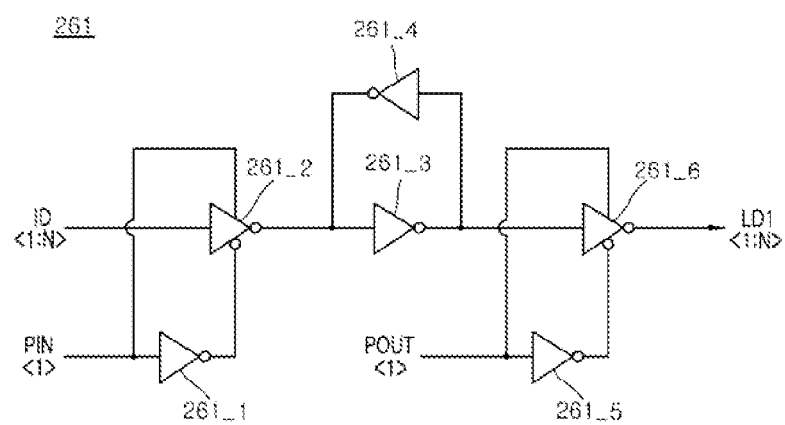
FIG. 9 is a circuit diagram illustrating a configuration of a first pipe circuit included in the data processing circuit illustrated in FIG. 8.

FIG. 9 is a circuit diagram illustrating a configuration of a first pipe circuit 261 included in the data processing circuit illustrated in FIG. 8. As illustrated in FIG. 9, the first pipe circuit 261 may be implemented with inverters 261_1, 261_2, 261_3, 261_4, 261_5, and 261_6.

The inverter 261_1 may inversely buffer the first input control signal PIN<1> to output an inversely buffered signal of the first input control signal PIN<1>.

The inverter 261_2 may be turned-on to receive the internal data ID<1:N> during a period in which the first input control signal PIN<1> is input at a logic "high" level, and may inversely buffer the internal data ID<1:N> to output an inversely buffered signal of the internal data ID<1:N>.

The inverters 261_3 and 261_4 may inversely buffer an output signal of the inverter 261_2 to output an inversely buffered signal of the output signal, and may latch an output signal of the inverter 261_2.

The inverter 261_5 may inversely buffer the first output control signal POUT<1> to output an inversely buffered signal of the first output control signal POUT<1>.

The inverter 261_6 may be turned-on during a period in which the first output control signal POUT<1> is input at a logic "high" level and may inversely buffer an output signal of the inverter 261_3 to output an inversely buffered signal of the output signal as the first latch data LD1<1:N>. The inverter 261_6 may output the first latch data LD1<1:N> to the internal node (ND21 of FIG. 8).

Meanwhile, the first pipe circuit 261 illustrated in FIG. 9 is illustrated as one circuit for convenience of description, the first pipe circuit 261 illustrated in FIG. 9 may be implemented with N circuits equal to the number of bits of the internal data ID<1:N> and the first latch data LD1<1:N>.

The second to fourth pipe circuits 262, 263, and 264 illustrated in FIG. 8 differ from the first pipe circuit 261 illustrated in FIG. 9 only in input/output signals, but are implemented with the same circuits and perform the same operations, so detailed descriptions thereof will be omitted.

Figure 10:
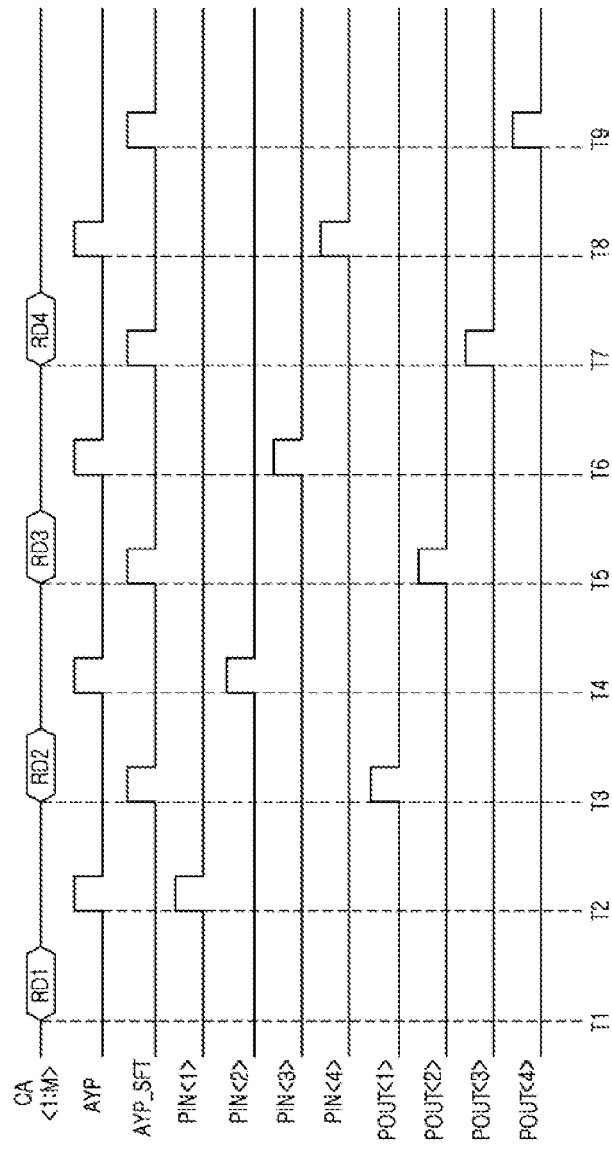
FIGS. 10 and 11 are timing diagrams illustrating an operation of an electronic system according to an embodiment of the present disclosure.
Figure 11:
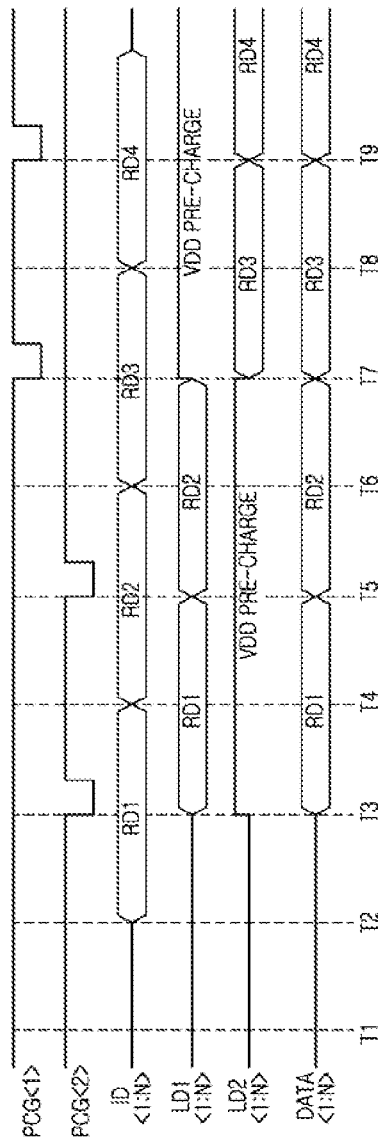

FIGS. 10 and 11 are timing diagrams illustrating an operation of an electronic system 100 according to an embodiment of the present disclosure. Hereinafter, an operation of the electronic system 100 according to an embodiment of the present invention will be described with reference to FIGS. 10 and 11 together with FIG. 2, and operations in which the read operation is performed four times in succession will be described as follows.

At time point T1, the controller 110 outputs a command address CA<1:M> for performing a first read operation RD1.

At time point T2, the column pulse generation circuit 210 generates a column pulse AYP for performing the first read operation RD1, based on the command address CA<1:M> in synchronization with a clock CLK.

The pipe control circuit 230 generates a first input control signal PIN<1> with a pulse that is generated according to the column pulse AYP.

The core circuit 250 outputs internal data ID<1:N> stored therein based on the pulse of the column pulse AYP. At this time, the internal data ID<1:N> is set as the internal data ID<1:N> for the first read operation RD1.

The data processing circuit 260 latches the internal data ID<1:N> based on the first input control signal PIN<1>.

At time point T3, the controller 110 outputs a command address CA<1:M> for performing a second read operation RD2.

The shift circuit 220 delays the column pulse AYP at time point T2 by a latency period in synchronization with the clock CLK to generate a column shifting pulse AYP_SFT.

The pipe control circuit 230 outputs a first output control signal POUT<1> including a pulse that is generated based on the column shifting pulse AYP_SFT.

The pre-charge control circuit 240 generates a second pre-charge signal PCG<2> with a pulse that is generated based on the first output control signal POUT<1>.

The data processing circuit 260 pre-charges the second internal node ND22 to the power voltage VDD level based on the second pre-charge signal PCG<2>. The data processing circuit 260 outputs the latched internal data ID<1:N> to the first internal node ND21 based on the first output control signal POUT<1>. At this time, the internal data ID<1:N> loaded on the first internal node ND21 is set as the first latch signal LD1<1:N>, and the first latch signal LD1<1:N> is set as the first latch data LD1<1:N> for the first read operation RD1. The second internal node ND22 is pre-charged to the power voltage VDD level, so that the data processing circuit 260 generates second latch data LD2<1:N> at the power voltage VDD level. The data processing circuit 260 generates data DATA<1:N> from the first latch data LD1<1:N> according to a logic level of the second internal node ND22 of the power voltage VDD level. The data processing circuit 260 outputs the data DATA<1:N> to the controller 110. At this time, the data DATA<1:N> is set as data DATA<1:N> for the first read operation RD1.

At time point T4, the column pulse generation circuit 210 generates the column pulse AYP, based on the command address CA<1:M> for performing a second read operation RD2 in synchronization with the clock CLK.

The pipe control circuit 230 generates a second input control signal PIN<2> with a pulse that is generated according to the column pulse AYP.

The core circuit 250 outputs the internal data ID<1:N> stored therein based on a pulse of the column pulse AYP. In this case, the internal data ID<1:N> is set as internal data ID<1:N> for the second read operation RD2.

The data processing circuit 260 latches the internal data ID<1:N> based on the second input control signal PIN<2>.

At time point T5, the controller 110 outputs a command address CA<1:M> for performing a third read operation.

The shift circuit 220 generates a column shifting pulse AYP_SFT by delaying the column pulse AYP at the time point T4 by a latency period in synchronization with the clock CLK.

The pipe control circuit 230 generates a second output control signal POUT<2> with a pulse that is generated based on the column shifting pulse AYP_SFT.

The pre-charge control circuit 240 generates a second pre-charge signal PCG<2> with a pulse that is generated based on the second output control signal POUT<2>.

The data processing circuit 260 pre-charges the second internal node ND22 to a power voltage VDD level based on the second pre-charge signal PCG<2>. The data processing circuit 260 outputs the latched internal data ID<1:N> to the first internal node ND21 based on the second output control signal POUT<2>. In this case, the internal data ID<1:N> loaded on the first internal node ND21 is set as the first latch data LD1<1:N>, and the first latch data LD1<1:N> is set as the latch data LD1<1:N> for performing the second read operation RD2. The second internal node ND22 is pre-charged to the power voltage VDD level, so that the data processing circuit 260 generates second latch data LD2<1:N> of the power voltage VDD level. The data processing circuit 260 generates data DATA<1:N> from the first latch data LD1<1:N> according to a logic level of the second internal node ND22 of the power voltage VDD level. The data processing circuit 260 outputs the data DATA<1:N> to the controller 110. At this time, the data DATA<1:N> is set as data DATA<1:N> for the second read operation RD2.

At time point T6, the column pulse generation circuit 210 generates the column pulse AYP, based on the command address CA<1:M> for performing the third read operation in synchronization with the clock CLK.

The pipe control circuit 230 generates a third input control signal PIN<3> with a pulse that is generated according to the column pulse AYP.

The core circuit 250 outputs the internal data ID<1:N> stored therein based on the pulse of the column pulse AYP. At this time, the internal data ID<1:N> is set as internal data ID<1:N> for the third read operation RD3.

The data processing circuit 260 latches the internal data ID<1:N> based on the third input control signal PIN<3>.

At time point T7, the controller 110 outputs a command address CA<1:M> for performing a fourth read operation RD4.

The shift circuit 220 generates a column shifting pulse AYP_SFT by delaying the column pulse AYP at the time point T6 in synchronization with the clock CLK.

The pipe control circuit 230 generates a third output control signal POUT<3> with a pulse that is generated based on the column shifting pulse AYP_SFT.

The pre-charge control circuit 240 generates the first pre-charge signal PCG<1> with a pulse that is generated based on the third output control signal POUT<3>.

The data processing circuit 260 pre-charges the first internal node ND21 to the power voltage VDD level based on the first pre-charge signal PCG<1>. The data processing circuit 260 outputs the latched internal data ID<1:N> to the second internal node ND22 based on the third output control signal POUT<3>. At this time, the internal data ID<1:N> loaded on the second internal node ND22 is set as second latch data LD2<1:N>, and the second latch data LD2<1:N> is set as the second latch data LD2<1:N> for the third read operation RD3. The first internal node ND21 is pre-charged to the power voltage VDD level, so that the data processing circuit 260 generates first latch data LD1<1:N> of the power voltage VDD level. The data processing circuit 260 generates data DATA<1:N> from the second latch data LD2<1:N> according to a logic level of the first internal node ND21 of the power voltage VDD level. The data processing circuit 260 outputs the data DATA<1:N> to the controller 110. At this time, the data DATA<1:N> is set as data DATA<1:N> for the third read operation RD3.

At time point T8, the column pulse generation circuit 210 generates the column pulse AYP, based on a command address CA<1:M> for performing a fourth read operation in synchronization with the clock CLK.

The pipe control circuit 230 generates a fourth input control signal PIN<4> with a pulse that is generated according to the column pulse AYP.

The core circuit 250 outputs the internal data ID<1:N> stored therein based on the pulse of the column pulse AYP. At this time, the internal data ID<1:N> is set as internal data ID<1:N> for the fourth read operation RD4.

The data processing circuit 260 latches the internal data ID<1:N> based on the fourth input control signal PIN<4>.

At time point T9, the shift circuit 220 generates a column shifting pulse AYP_SFT by delaying the column pulse AYP at the time point T8 by a latency period in synchronization with the clock CLK.

The pipe control circuit 230 generates a fourth output control signal POUT<4> with a pulse that is generated based on the column shifting pulse AYP_SFT.

The pre-charge control circuit 240 generates a first pre-charge signal PCG<1> with a pulse that is generated based on the fourth output control signal POUT<4>.

The data processing circuit 260 pre-charges the first internal node ND21 to the power voltage VDD level based on the first pre-charge signal PCG<1>. The data processing circuit 260 outputs the latched internal data ID<1:N> to the second internal node ND22 based on the fourth output control signal POUT<4>. At this time, the internal data ID<1:N> loaded on the second internal node ND22 is set as second latch data LD2<1:N>, and the second latch data LD2<1:N> is set as the second latch data LD2<1:N> for the fourth read operation RD4. The first internal node ND21 is pre-charged to the power voltage VDD level, so that the data processing circuit 260 generates first latch data LD1<1:N> of the power voltage VDD level. The data processing circuit 260 generates data DATA<1:N> from the second latch data LD2<1:N> according to a logic level of the first internal node ND21 of the power voltage VDD level. The data processing circuit 260 outputs the data DATA<1:N> to the controller 110. At this time, the data DATA<1:N> is set as data DATA<1:N> for the fourth read operation RD4.

The electronic system according to an embodiment of the present disclosure pre-charges an unused internal node among the internal nodes connected to a plurality of pipe circuits to a power voltage level during a read operation, thereby reducing loading of the internal nodes. The electronic system according to an embodiment of the present disclosure pre-charges an unused internal node among the internal nodes connected to a plurality of pipe circuits to a power voltage level during a read operation to load on the internal nodes, thereby outputting data at high speed.

Figure 12:
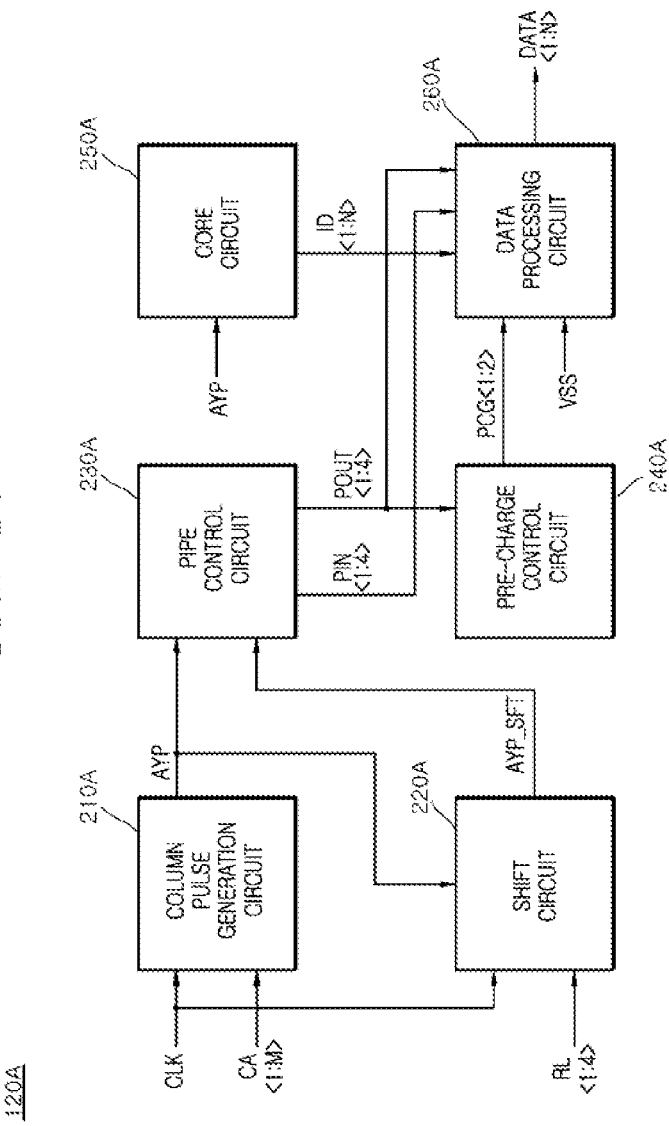
FIG. 12 is a block diagram illustrating a configuration of an electronic device included in an electronic system according to another embodiment of the present disclosure.

FIG. 12 is a block diagram illustrating a configuration of an electronic device 120A included in an electronic system according to another embodiment of the present disclosure.

As illustrated in FIG. 12, the electronic device 120A may include a column pulse generation circuit 210A, a shift circuit 220A, a pipe control circuit 230A, a pre-charge control circuit 240A, a core circuit 250A, and a data processing circuit 260A.

The column pulse generation circuit 210A may generate a column pulse AYP, based on a command address CA<1:M> in synchronization with a clock CLK. The column pulse generation circuit 210A may generate the column pulse AYP with a pulse that is generated when the command address CA<1:M> input in synchronization with the clock CLK is a combination of logic levels to perform a read operation.

The shift circuit 220A may generate a column shifting pulse AYP_SFT by delaying the column pulse AYP by a latency period in synchronization with the clock CLK. The shift circuit 220A may generate the column shifting pulse AYP_SFT by delaying the column pulse AYP with a delay amount that is adjusted based on first to fourth latency signals RL<1:4> in synchronization with the clock CLK.

The pipe control circuit 230A may generate first to fourth input control signals PIN<1:4> with pulses that are sequentially generated according to the column pulse AYP. The pipe control circuit 230A may generate the first to fourth input control signals PIN<1:4> with the pulses that are sequentially generated each time the pulse of the column pulse AYP is input. The pipe control circuit 230A may generate first to fourth output control signals POUT<1:4> with pulses that are sequentially generated according to the column shifting pulse AYP_SFT. The pipe control circuit 230A may generate the first to fourth output control signals POUT<1:4> with the pulses that are sequentially generated each time the pulse of the column shifting pulse AYP_SFT is input.

The pre-charge control circuit 240A may generate first and second pre-charge signals PCG<1:2> with pulses that are selectively generated based on the first to fourth output control signals POUT<1:4>. The pre-charge control circuit 240A may generate the first pre-charge signal PCG<1> with a pulse that is generated based on the third and fourth output control signals POUT<3:4>. The pre-charge control circuit 240A may generate the second pre-charge signal PCG<2> with a pulse that is generated based on the first and second output control signals POUT<1:2>.

The core circuit 250A may be implemented with a general memory circuit with a plurality of memory cells (not illustrated). The core circuit 250A may output internal data ID<1:N> stored therein based on the pulse of the column pulse AYP.

The data processing circuit 260A may pre-charge one of first and second internal nodes (ND21A and ND22A of FIG. 14) based on the first and second pre-charge signals PCG<1:2>. The data processing circuit 260A may pre-charge one of the first and second internal nodes (ND21A and ND22A of FIG. 14) to a ground voltage VSS level based on the first and second pre-charge signals PCG<1:2>. The data processing circuit 260A may latch the internal data ID<1:N> based on the first to fourth input control signals PIN<1:4>. The data processing circuit 260A may generate data DATA<1:N> from the latched internal data ID<1:N> based on the first to fourth output control signals POUT<1:4>. The data processing circuit 260A may output the DATA<1:N> to the controller 110. The number N of bits of the data DATA<1:N> may be set to various numbers according to embodiments. The numbers of bits of the internal data ID<1:N> and the data DATA<1:N> may be set to the same number N.

Meanwhile, the column pulse generation circuit 210A, the shift circuit 220A, the pipe control circuit 230A, and the core circuit 250A may be implemented with the same circuits as the column pulse generation circuit 210, the shift circuit 220, the pipe control circuit 230, and the core circuit 250 illustrated in FIG. 2 and perform the same operations, and thus, a detailed description will be omitted.

Figure 13:
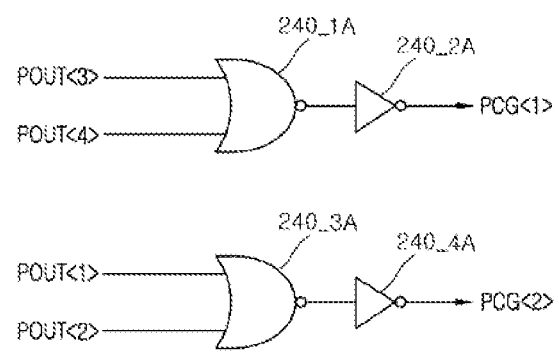
FIG. 13 is a circuit diagram illustrating a configuration of a pre-charge control circuit included in the electronic device illustrated in FIG. 12.

FIG. 13 is a circuit diagram illustrating a configuration of the pre-charge control circuit 240A included in the electronic device illustrated in FIG. 12. As illustrated in FIG. 13, the pre-charge control circuit 240A may be implemented with NOR gates 240_1A and 240_3A, and inverters 240_2A and 240_4A.

The NOR gate 240_1A and the inverter 240_2A may perform an OR operation for a third output control signal POUT<3> and a fourth output control signal POUT<4> to generate a first pre-charge signal PCG<1>. The NOR gate 240_1A and the inverter 240_2A may generate a first pre-charge signal PCG<1> of a logic "high" level when one of the third output control signal POUT<3> and the fourth output control signal POUT<4> is input at a logic "high" level. The NOR gate 240_1A and the inverter 240_2A may generate a first pre-charge signal PCG<1> of a logic "low" level when both the third output control signal POUT<3> and the fourth output control signal POUT<4> are input at a logic "low" level.

The NOR gate 240_3A and the inverter 240_4A may perform an OR operation for a first output control signal POUT<1> and a second output control signal POUT<2> to generate a second pre-charge signal PCG<2>. The NOR gate 240_3A and the inverter 240_4A may generate a second pre-charge signal PCG<2> of a logic "high" level when one of the first output control signal POUT<1> and the second output control signal POUT<2> is input at a logic "high" level. The NOR gate 240_3A and the inverter 240_4A may generate a second pre-charge signal PCG<2> of a logic "low" level when both the first output control signal POUT<1> and the second output control signal POUT<2> are input at a logic "low" level.

Figure 14:
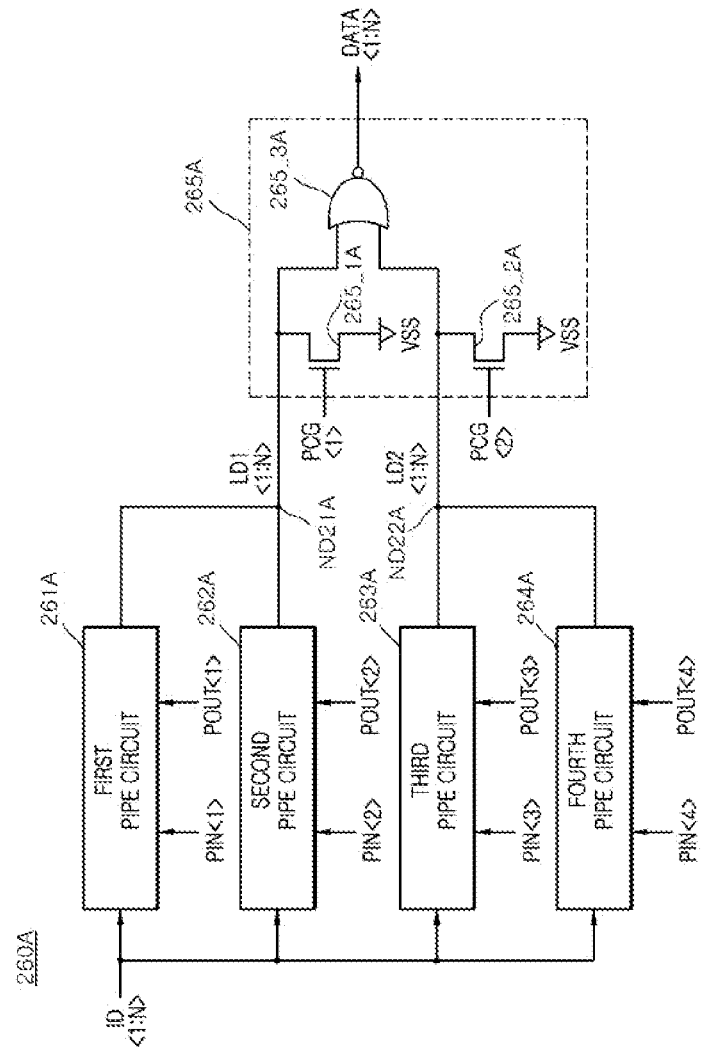
FIG. 14 is a diagram illustrating a configuration of a data processing circuit included in the electronic device illustrated in FIG. 12.

FIG. 14 is a diagram illustrating a configuration of the data processing circuit 260A included in the electronic device illustrated in FIG. 12. As illustrated in FIG. 14, the data processing circuit 260 may include a first pipe circuit 261A, a second pipe circuit 262A, a third pipe circuit 263A, a fourth pipe circuit 264A, and a data output circuit 265A.

The first pipe circuit 261A may latch internal data ID<1:N> based on a pulse of the first input control signal PIN<1>. The first pipe circuit 261A may output the latched internal data ID<1:N> based on the pulse of the first output control signal POUT<1> to the first internal node ND21. The internal data ID<1:N> loaded on the first internal node ND21 may be set as first latch data LD1<1:N>.

The second pipe circuit 262A may latch the internal data ID<1:N> based on a pulse of the second input control signal PIN<2>. The second pipe circuit 262A may output the latched internal data ID<1:N> based on the pulse of the second output control signal POUT<2> to the first internal node ND21A. The internal data ID<1:N> loaded on the first internal node ND21A may be set as first latch data LD1<1:N>.

The third pipe circuit 263A may latch the internal data ID<1:N> based on a pulse of the third input control signal PIN<3>. The third pipe circuit 263A may output the latched internal data ID<1:N> based on the pulse of the third output control signal POUT<3> to the second internal node ND22A. The internal data ID<1:N> loaded on the second internal node ND22A may be set as second latch data LD2<1:N>.

The fourth pipe circuit 264A may latch the internal data ID<1:N> based on a pulse of the fourth input control signal PIN<4>. The fourth pipe circuit 264 may output the latched internal data ID<1:N> based on the pulse of the fourth output control signal POUT<4> to the second internal node ND22A. The internal data ID<1:N> loaded on the second internal node ND22A may be set as the second latch data LD2<1:N>.

The data output circuit 265A may be implemented with a first pre-charge device 265_1A, a second pre-charge device 265_2A, and a logic device 265_3A.

The first pre-charge device 265_1A may be implemented with an NMOS transistor disposed between the first internal node ND21A and the ground voltage VSS. The first pre-charge device 265_1A may be turned-on when the first pre-charge signal PCG<1> is input at a logic "high" level to pre-charge the first internal node ND21A to the ground voltage VSS level. The first pre-charge device 265_1A may be turned-off when the first pre-charge signal PCG<1> is input at a logic "low" level.

The second pre-charge device 265_2A may be implemented with an NMOS transistor disposed between the second internal node ND22A and the ground voltage VSS. The second pre-charge device 265_2A may be turned-on when the second pre-charge signal PCG<2> is input at a logic "high" level to pre-charge the second internal node ND22A to the ground voltage VSS level. The second pre-charge device 265_2A may be turned-off when the second pre-charge signal PCG<2> is input at a logic "low" level.

The logic device 265_3A may be implemented with a NOR gate. The logic device 265_3A may generate data DATA<1:N> according to the logic levels of the first internal node ND21A and the second internal node ND22A. The logic device 265_3A may inversely buffer the second latch data LD2<1:N> loaded on the second internal node ND22A to generate the data DATA<1:N> when the first internal node ND21A is pre-charged to the ground voltage VSS level. The logic device 265_3A may inversely buffer the first latch data LD1<1:N> loaded on the first internal node ND21A to generate the data DATA<1:N> when the second internal node ND22A is pre-charged to the ground voltage VSS level.

The electronic system according to an embodiment of the present disclosure pre-charges an unused internal node among the internal nodes connected to a plurality of pipe circuits to a ground voltage level during a read operation, thereby reducing loading of the internal nodes. The electronic system according to an embodiment of the present disclosure pre-charges an unused internal node among the internal nodes connected to a plurality of pipe circuits to a ground voltage level during a read operation to load on the internal nodes, thereby outputting data at high speed.

Figure 15:
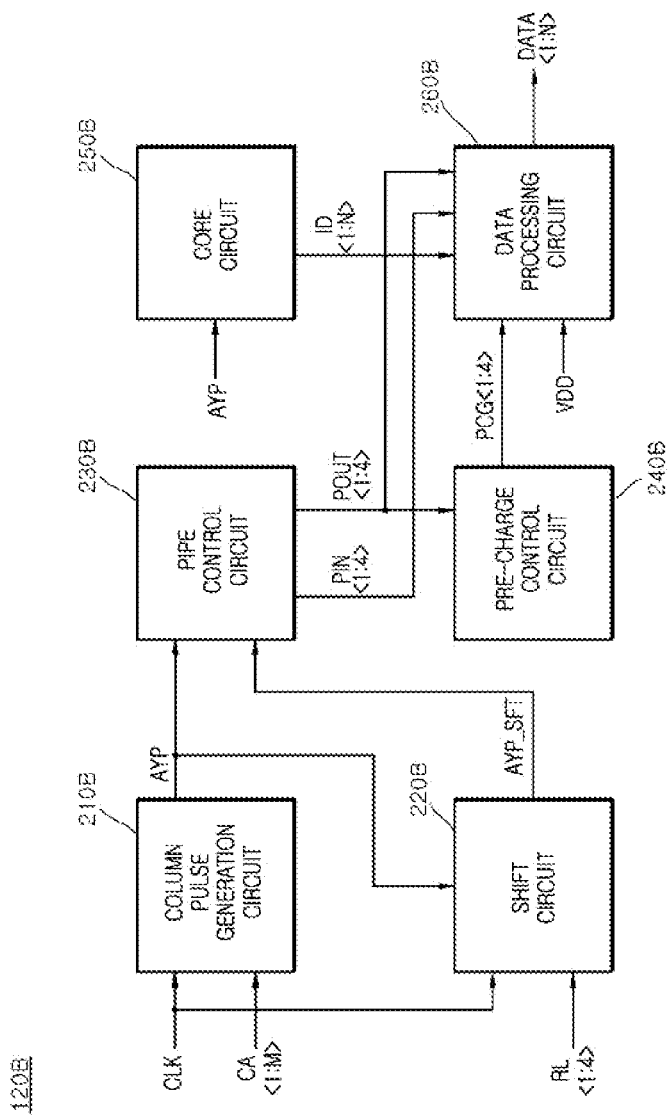
FIG. 15 a block diagram illustrating a configuration of an electronic device included in an electronic system according to another embodiment of the present disclosure.

FIG. 15 a block diagram illustrating a configuration of an electronic device 120B included in an electronic system according to another embodiment of the present disclosure.

As illustrated in FIG. 15, the electronic device 120B may include a column pulse generation circuit 2106, a shift circuit 220B, a pipe control circuit 230B, a pre-charge control circuit 240B, a core circuit 250B, and a data processing circuit 260B.

The column pulse generation circuit 210B may generate a column pulse AYP, based on a command address CA<1:M> in synchronization with a clock CLK. The column pulse generation circuit 210B may generate the column pulse AYP with a pulse that is generated when the command address CA<1:M> input in synchronization with the clock CLK is a combination of logic levels for performing a read operation.

The shift circuit 220B may generate a column shifting pulse AYP_SFT by delaying the column pulse AYP by a latency period in synchronization with the clock CLK. The shift circuit 220B may generate the column shifting pulse AYP_SFT by delaying the column pulse AYP with a delay amount that is adjusted based on first to fourth latency signals RL<1:4> in synchronization with the clock CLK.

The pipe control circuit 230B may generate first to fourth input control signals PIN<1:4> with pulses that are sequentially generated according to the column pulse AYP. The pipe control circuit 230B may generate the first to fourth input control signals PIN<1:4> with the pulses that are sequentially generated each time the pulse of the column pulse AYP is input. The pipe control circuit 230B may generate first to fourth output control signals POUT<1:4> with pulses that are sequentially generated according to the column shifting pulse AYP_SFT. The pipe control circuit 230B may generate the first to fourth output control signals POUT<1:4> with the pulses that are sequentially generated each time the pulse of the column shifting pulse AYP_SFT is input.

The pre-charge control circuit 240B may generate first to fourth pre-charge signals PCG<1:4> with a pulse selectively generated based on the first to fourth output control signals POUT<1:4>.

The core circuit 250B may be implemented with a general memory circuit with a plurality of memory cells (not illustrated). The core circuit 250B may output internal data ID<1:N> stored therein based on the pulse of the column pulse AYP during a read operation.

The data processing circuit 260B may selectively pre-charge first to fourth internal nodes (ND21B, ND22B, ND23B, and ND24B of FIG. 17) based on the first to fourth pre-charge signals PCG<1:4>. The data processing circuit 260B may selectively pre-charge the first to fourth internal nodes (ND21B, ND22B, ND23B, and ND24B of FIG. 17) to a power voltage VDD level based on the first to fourth pre-charge signals PCG<1:4>. The data processing circuit 260B may latch the internal data ID<1:N> based on the first to fourth input control signals PIN<1:4>. The data processing circuit 260B may generate data DATA<1:N> from the latched internal data ID<1:N> based on the first to fourth output control signals POUT<1:4>. The data processing circuit 260B may output the DATA<1:N> to the controller 110. The number N of bits of the data DATA<1:N> may be set to various numbers according to embodiments. The numbers of bits of the internal data ID<1:N> and the data DATA<1:N> may be set to the same number N.

Meanwhile, the column pulse generation circuit 210B, the shift circuit 220B, the pipe control circuit 230B, and the core circuit 250B are implemented with the same circuits as the column pulse generation circuit 210, the shift circuit 220, the pipe control circuit 230, and the core circuit 250 illustrated in FIG. 2 and perform the same operations, and thus, a detailed description will be omitted.

Figure 16:
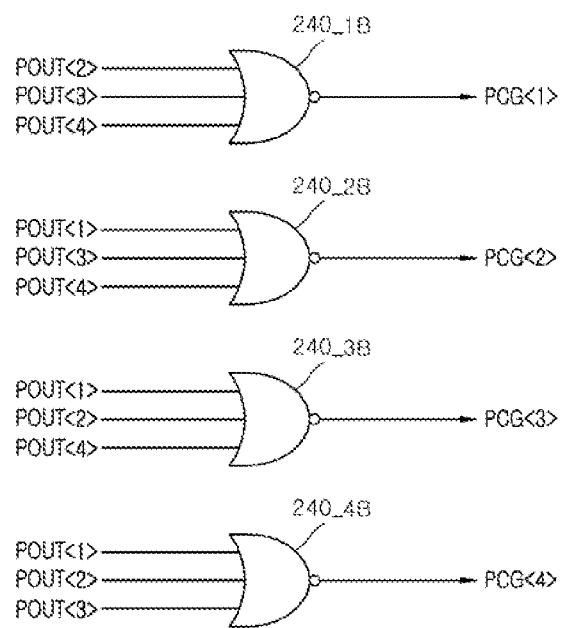
FIG. 16 is a circuit diagram illustrating a configuration of a pre-charge control circuit included in the electronic device illustrated in FIG. 15.

FIG. 16 is a circuit diagram illustrating a configuration of the pre-charge control circuit 240B included in the electronic device illustrated in FIG. 15. As illustrated in FIG. 16, the pre-charge control circuit 240B may be implemented with NOR gates 240_1B, 240_2B, 240_3B, and 240_4B.

The NOR gate 240_1B may perform a NOR operation for the second output control signal POUT<2>, the third output control signal POUT<3>, and the fourth output control signal POUT<4> to generate the first pre-charge signal PCG<1>. The NOR gate 240_16 may generate a first pre-charge signal PCG<1> of a logic "low" level when one of the second output control signal POUT<2>, the third output control signal POUT<3>, and the fourth output control signal POUT<4> is input at a logic "high" level. The NOR gate 240_1B may generate a first pre-charge signal PCG<1> of a logic "high" level when all the second output control signal POUT<2>, the third output control signal POUT<3>, and the fourth output control signal POUT<4> are input at a logic "low" level.

The NOR gate 240_2B may perform a NOR operation for the first output control signal POUT<1>, the third output control signal POUT<3>, and the fourth output control signal POUT<4> to generate the second pre-charge signal PCG<2>. The NOR gate 240_2B may generate a second pre-charge signal PCG<2> of a logic "low" level when one of the first output control signal POUT<1>, the third output control signal POUT<3>, and the fourth output control signal POUT<4> is input at a logic "high" level. The NOR gate 240_2B may generate a second pre-charge signal PCG<2> of a logic "high" level when all the first output control signal POUT<1>, the third output control signal POUT<3>, and the fourth output control signal POUT<4> are input at a logic "low" level.

The NOR gate 240_3B may perform a NOR operation for the first output control signal POUT<1>, the second output control signal POUT<2>, and the fourth output control signal POUT<4> to generate the third pre-charge signal PCG<3>. The NOR gate 240_3B may generate a third pre-charge signal PCG<3> of a logic "low" level when one of the first output control signal POUT<1>, the second output control signal POUT<2>, and the fourth output control signal POUT<4> is input at a logic "high" level. The NOR gate 240_3B may generate a second pre-charge signal PCG<2> of a logic "high" level when all the first output control signal POUT<1>, the second output control signal POUT<2>, and the fourth output control signal POUT<4> are input at a logic "low" level.

The NOR gate 240_2B may perform a NOR operation for the first output control signal POUT<1>, the second output control signal POUT<2>, and the third output control signal POUT<3> to generate the fourth pre-charge signal PCG<4>. The NOR gate 240_2B may generate a fourth pre-charge signal PCG<4> of a logic "low" level when one of the first output control signal POUT<1>, the second output control signal POUT<2>, and the third output control signal POUT<3> is input at a logic "high" level. The NOR gate 240_2B may generate a fourth pre-charge signal PCG<4> of a logic "high" level when all the first output control signal POUT<1>, the second output control signal POUT<2>, and the third output control signal POUT<3> are input at a logic "low" level.

Figure 17:
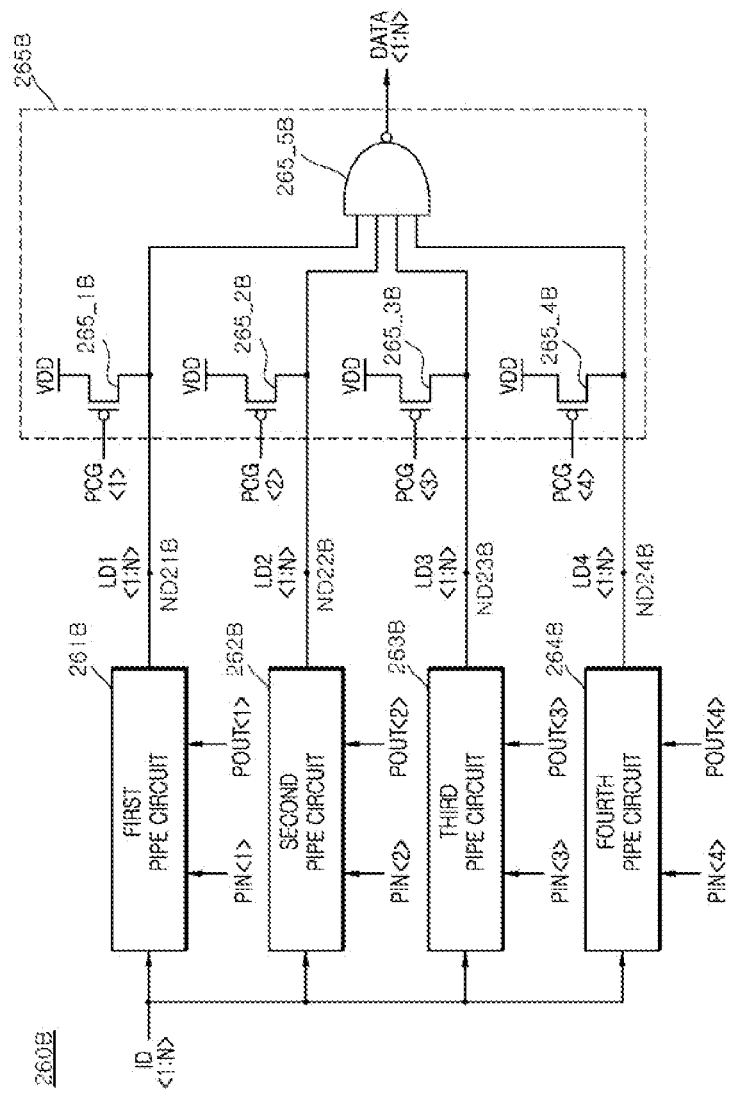
FIG. 17 is a diagram illustrating a configuration of a data processing circuit included in the electronic device illustrated in FIG. 15.

FIG. 17 is a diagram illustrating a configuration of the data processing circuit 260B included in the electronic device illustrated in FIG. 15. As illustrated in FIG. 17, the data processing circuit 260B may include a first pipe circuit 261B, a second pipe circuit 262B, a third pipe circuit 263B, a fourth pipe circuit 264B, and a data output circuit 265B.

The first pipe circuit 261B may latch the internal data ID<1:N> based on a pulse of the first input control signal PIN<1>. The first pipe circuit 261B may output the latched internal data ID<1:N> to a first internal node ND21B based on the pulse of the first output control signal POUT<1>. The internal data ID<1:N> loaded on the first internal node ND21B may be set as first latch data LD1<1:N>.

The second pipe circuit 262B may latch the internal data ID<1:N> based on a pulse of the second input control signal PIN<2>. The second pipe circuit 262B may output the latched internal data ID<1:N> to a second internal node ND22B based on the pulse of the second output control signal POUT<2>. The internal data ID<1:N> loaded on the first internal node ND22B may be set as second latch data LD2<1:N>.

The third pipe circuit 263B may latch the internal data ID<1:N> based on a pulse of the third input control signal PIN<3>. The third pipe circuit 263B may output the latched internal data ID<1:N> to a third internal node ND23B based on the pulse of the third output control signal POUT<3>. The internal data ID<1:N> loaded on the third internal node ND23B may be set as third latch data LD3<1:N>.

The fourth pipe circuit 264B may latch the internal data ID<1:N> based on a pulse of the fourth input control signal PIN<4>. The fourth pipe circuit 264B may output the latched internal data ID<1:N> to a fourth internal node ND24B based on the pulse of the fourth output control signal POUT<4>. The internal data ID<1:N> loaded on the fourth internal node ND24B may be set as fourth latch data LD4<1:N>.

The data output circuit 265B may be implemented with a first pre-charge device 265_1B, a second pre-charge device 265_2B, a third pre-charge device 265_3B, a fourth pre-charge device 265_4B, and a logic device 265_5B.

The first pre-charge device 265_1B may be implemented with a PMOS transistor disposed between the power voltage VDD and the first internal node ND21B. The first pre-charge device 265_1B may be turned-on when the first pre-charge signal PCG<1> is input at a logic "low" level to pre-charge the first internal node ND21B to the power voltage VDD level. The first pre-charge device 265_1B may be turned-off when the first pre-charge signal PCG<1> is input at a logic "high" level.

The second pre-charge device 265_2B may be implemented with a PMOS transistor disposed between the power voltage VDD and the second internal node ND22B. The second pre-charge device 265_2B may be turned-on when the second pre-charge signal PCG<2> is input at a logic "low" level to pre-charge the second internal node ND22B to the power voltage VDD level. The second pre-charge device 265_2B may be turned-off when the second pre-charge signal PCG<2> is input at a logic "high" level.

The third pre-charge device 265_3B may be implemented with a PMOS transistor disposed between the power voltage VDD and the third internal node ND23B. The third pre-charge device 265_3B may be turned-on when the third pre-charge signal PCG<3> is input at a logic "low" level to pre-charge the third internal node ND23B to the power voltage VDD level. The third pre-charge device 265_3B may be turned-off when the third pre-charge signal PCG<3> is input at a logic "high" level.

The fourth pre-charge device 265_4B may be implemented with a PMOS transistor disposed between the power voltage VDD and the fourth internal node ND24B. The fourth pre-charge device 265_4B may be turned-on when the fourth pre-charge signal PCG<4> is input at a logic "low" level to pre-charge the fourth internal node ND24B to the power voltage VDD level. The fourth pre-charge device 265_4B may be turned-off when the fourth pre-charge signal PCG<4> is input at a logic "high" level.

The logic device 265_5B may be implemented with a NAND gate. The logic device 265_5B may generate data DATA<1:N> according to logic levels of the first internal node ND21B, the second internal node ND22B, the third internal node ND23B, and the fourth internal node ND24B. The logic device 265_5B may inversely buffer the first latch data LD1<1:N> loaded on the first internal node ND21B to the generate the data DATA<1:N> when the second internal node ND22B, the third internal node ND23B, and the fourth internal node ND24B are pre-charged to the power voltage VDD level. The logic device 265_5B may inversely buffer the second latch data LD2<1:N> loaded on the second internal node ND22B to generate the data DATA<1:N> when the first internal node ND21B, the third internal node ND23B, and the fourth internal node ND24B are pre-charged to the power voltage VDD level. The logic device 265_5B may inversely buffer the third latch data LD3<1:N> loaded on the third internal node ND23B to generate the data DATA<1:N> when the first internal node ND21B, the second internal node ND22B, and the fourth internal node ND24B are pre-charged to the power voltage VDD level. The logic device 265_5B may inversely buffer the fourth latch data LD4<1:N> loaded on the fourth internal node ND24B to generate the data DATA<1:N> when the first internal node ND21B, the second internal node ND22B, and the third internal node ND23B are pre-charged to the power voltage VDD level.

The electronic system according to an embodiment of the present disclosure pre-charges an unused internal node among the internal nodes connected to a plurality of pipe circuits to a power voltage level during a read operation, thereby reducing loading of the internal nodes. The electronic system according to an embodiment of the present disclosure pre-charges the unused internal node among the internal nodes connected to a plurality of pipe circuits to a power voltage level during a read operation to load on the internal nodes, thereby outputting data at high speed.

Figure 18:
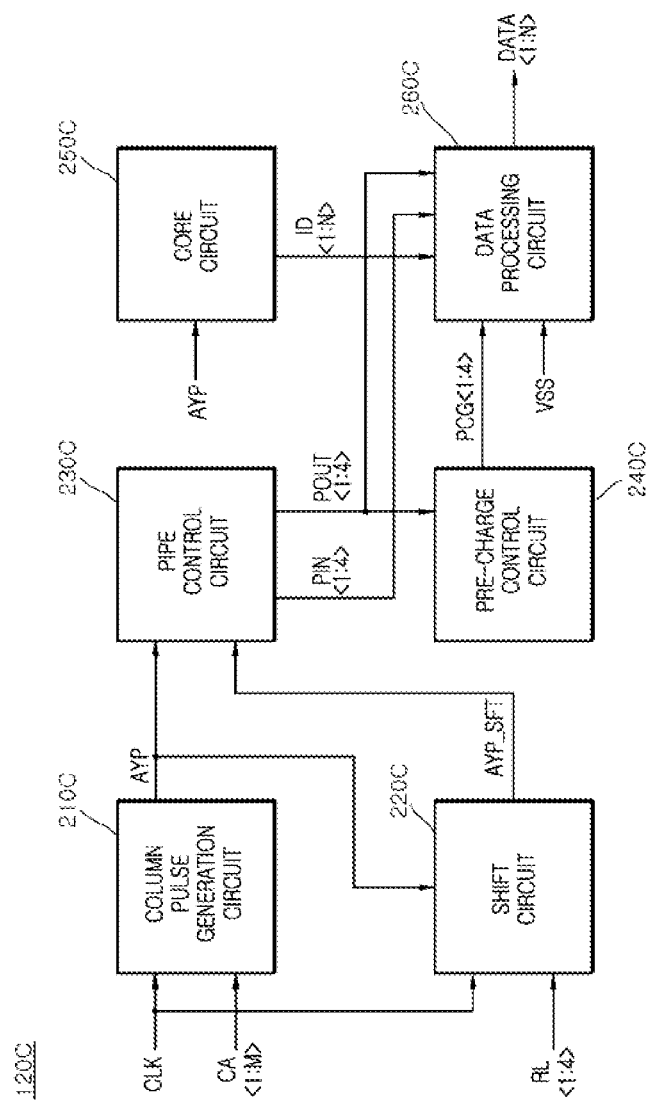
FIG. 18 a block diagram illustrating a configuration of an electronic device included in an electronic system according to another embodiment of the present disclosure.

FIG. 18 is a block diagram illustrating a configuration of an electronic device 120C included in an electronic system according to another embodiment of the present disclosure.

As illustrated in FIG. 18, the electronic device 120C may include a column pulse generation circuit 210C, a shift circuit 220C, a is pipe control circuit 230C, a pre-charge control circuit 240C, a core circuit 250C, and a data processing circuit 260C.

The column pulse generation circuit 210C may generate a column pulse AYP, based on a command address CA<1:M> in synchronization with a clock CLK. The column pulse generation circuit 210C may generate the column pulse AYP with a pulse that is generated when the command address CA<1:M> input in synchronization with the clock CLK is a combination of logic levels to perform a read operation.

The shift circuit 220C may generate a column shifting pulse AYP_SFT by delaying the column pulse AYP by a latency period in synchronization with the clock CLK. The shift circuit 220C may generate the column shifting pulse AYP_SFT by delaying the column pulse AYP with a delay amount that is adjusted based on first to fourth latency signals RL<1:4> in synchronization with the clock CLK.

The pipe control circuit 230C may generate first to fourth input control signals PIN<1:4> with pulses that are sequentially generated according to the column pulse AYP. The pipe control circuit 230C may generate the first to fourth input control signals PIN<1:4> with the pulses that are sequentially generated each time the pulse of the column pulse AYP is input. The pipe control circuit 230C may generate first to fourth output control signals POUT<1:4> with pulses that are sequentially generated according to the column shifting pulse AYP_SFT. The pipe control circuit 230C may generate the first to fourth output control signals POUT<1:4> with the pulses that are sequentially generated each time the pulse of the column shifting pulse AYP_SFT is input.

The pre-charge control circuit 240C may generate first to fourth pre-charge signals PCG<1:4> with a pulse selectively generated based on the first to fourth output control signals POUT<1:4>.

The core circuit 250C may be implemented with a general memory circuit with a plurality of memory cells (not illustrated). The core circuit 250C may output internal data ID<1:N> stored therein based on the pulse of the column pulse AYP.

The data processing circuit 260C may selectively pre-charge first to fourth internal nodes (ND21C, ND22C, ND23C, and ND24C of FIG. 20) based on the first to fourth pre-charge signals PCG<1:4>. The data processing circuit 260C may selectively pre-charge the first to fourth internal nodes (ND21C, ND22C, ND23C, and ND24C of FIG. 20) to a ground voltage VSS level based on the first to fourth pre-charge signals PCG<1:4>. The data processing circuit 260C may latch the internal data ID<1:N> based on the first to fourth input control signals PIN<1:4>. The data processing circuit 260C may generate data DATA<1:N> from the latched internal data ID<1:N> based on the first to fourth output control signals POUT<1:4>. The data processing circuit 260C may output the DATA<1:N> to the controller 110. The number N of bits of the data DATA<1:N> may be set to various numbers according to embodiments. The numbers of bits of the internal data ID<1:N> and the data DATA<1:N> may be set to the same number N.

Meanwhile, the column pulse generation circuit 210C, the shift circuit 220C, the pipe control circuit 230C, and the core circuit 250C are implemented with the same circuits as the column pulse generation circuit 210, the shift circuit 220, the pipe control circuit 230, and the core circuit 250 illustrated in FIG. 2 and perform the same operations, and thus, a detailed description will be omitted.

Figure 19:
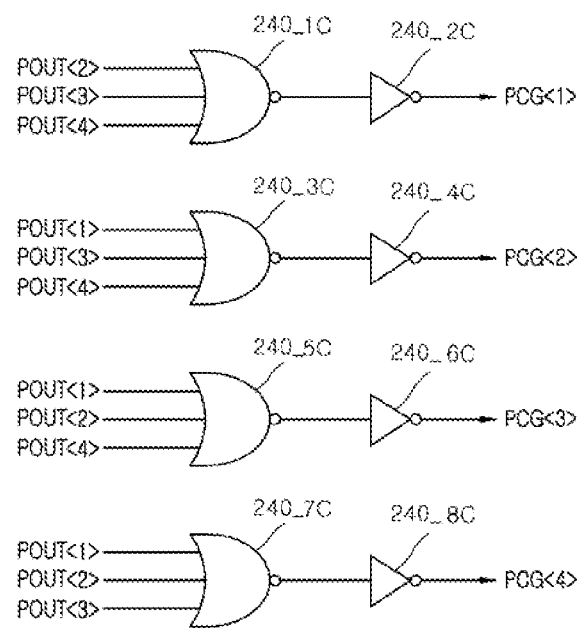
FIG. 19 is a circuit diagram illustrating a configuration of a pre-charge control circuit included in the electronic device illustrated in FIG. 18.

FIG. 19 is a circuit diagram illustrating a configuration of a pre-charge control circuit 240C included in the electronic device illustrated in FIG. 18. As illustrated in FIG. 19, the pre-charge control circuit 240C may be implemented with NOR gates 240_1C, 240_3C, 240_5C, and 240_7C, and inverters 240_2C, 240_4C, 240_6C, and 240_8C.

The NOR gate 240_1C and the inverter 240_2C may perform an OR operation for the second output control signal POUT<2>, the third output control signal POUT<3>, and the fourth output control signal POUT<4> to generate the first pre-charge signal PCG<1>. The NOR gate 240_1C and the inverter 240_2C may generate a first pre-charge signal PCG<1> of a logic "high" level when one of the second output control signal POUT<2>, the third output control signal POUT<3>, and the fourth output control signal POUT<4> is input at a logic "high" level. The NOR gate 240_1C and the inverter 240_2C may generate a first pre-charge signal PCG<1> of a logic "low" level when all the second output control signal POUT<2>, the third output control signal POUT<3>, and the fourth output control signal POUT<4> are input at a logic "low" level.

The NOR gate 240_3C and the inverter 240_4C may perform an OR operation for the first output control signal POUT<1>, the third output control signal POUT<3>, and the fourth output control signal POUT<4> to generate the second pre-charge signal PCG<2>. The NOR gate 240_3C and the inverter 240_4C may generate a second pre-charge signal PCG<2> of a logic "high" level when one of the first output control signal POUT<1>, the third output control signal POUT<3>, and the fourth output control signal POUT<4> is input at a logic "high" level. The NOR gate 240_3C and the inverter 240_4C may generate a second pre-charge signal PCG<2> of a logic "low" level when all the first output control signal POUT<1>, the third output control signal POUT<3>, and the fourth output control signal POUT<4> are input at a logic "low" level.

The NOR gate 240_5C and the inverter 240_6C may perform an OR operation for the first output control signal POUT<1>, the second output control signal POUT<2>, and the fourth output control signal POUT<4> to generate the third pre-charge signal PCG<3>. The NOR gate 240_5C and the inverter 240_6C may generate a third pre-charge signal PCG<3> of a logic "high" level when one of the first output control signal POUT<1>, the second output control signal POUT<2>, and the fourth output control signal POUT<4> is input at a logic "high" level. The NOR gate 240_5C and the inverter 240_6C may generate a third pre-charge signal PCG<3> of a logic "low" level when all the first output control signal POUT<1>, the second output control signal POUT<2>, and the fourth output control signal POUT<4> are input at a logic "low" level.

The NOR gate 240_7C and the inverter 240_8C may perform an OR operation for the first output control signal POUT<1>, the second output control signal POUT<2>, and the third output control signal POUT<3> to generate the fourth pre-charge signal PCG<4>. The NOR gate 240_7C and the inverter 240_8C may generate a fourth pre-charge signal PCG<2> of a logic "high" level when one of the first output control signal POUT<1>, the second output control signal POUT<2>, and the third output control signal POUT<3> is input at a logic "high" level. The NOR gate 240_7C and the inverter 240_8C may generate a fourth pre-charge signal PCG<4> of a logic "low" level when all the first output control signal POUT<1>, the second output control signal POUT<2>, and the third output control signal POUT<3> are input at a logic "low" level.

Figure 20:
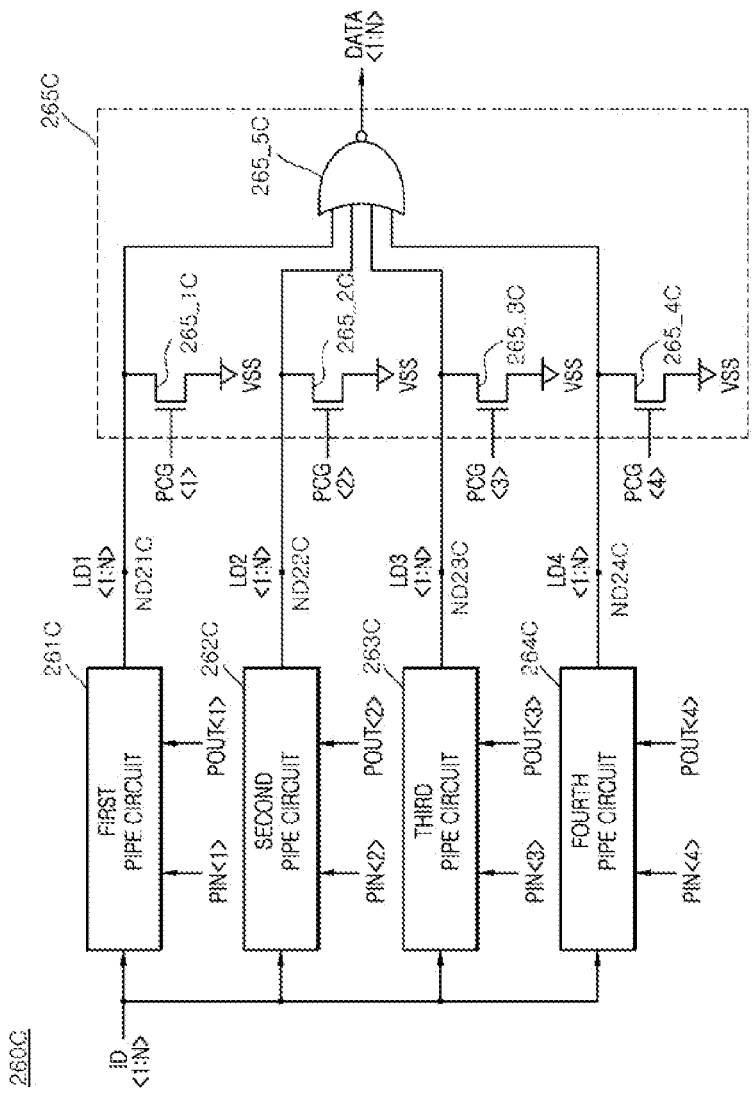
FIG. 20 is a diagram illustrating a configuration of a data processing circuit included in the electronic device illustrated in FIG. 18.

FIG. 20 is a diagram illustrating a configuration of a data processing circuit 260C included in the electronic device illustrated in FIG. 18. As illustrated in FIG. 20, the data processing circuit 260C may include a first pipe circuit 261C, a second pipe circuit 262C, a third pipe circuit 263C, a fourth pipe circuit 264C, and a data output circuit 265C.

The first pipe circuit 261C may latch the internal data ID<1:N> based on a pulse of the first input control signal PIN<1>. The first pipe circuit 261C may output the latched internal data ID<1:N> to the first internal node ND21C based on the pulse of the first output control signal POUT<1>. The internal data ID<1:N> loaded on the first internal node ND21C may be set as first latch data LD1<1:N>.

The second pipe circuit 262C may latch the internal data ID<1:N> based on a pulse of the second input control signal PIN<2>. The second pipe circuit 262C may output the latched internal data ID<1:N> to the second internal node ND22C based on the pulse of the second output control signal POUT<2>. The internal data ID<1:N> loaded on the second internal node ND22C may be set as second latch data LD2<1:N>.

The third pipe circuit 263C may latch the internal data ID<1:N> based on a pulse of the third input control signal PIN<3>. The third pipe circuit 263C may output the latched internal data ID<1:N> to the third internal node ND23C based on the pulse of the third output control signal POUT<3>. The internal data ID<1:N> loaded on the third internal node ND23C may be set as third latch data LD3<1:N>.

The fourth pipe circuit 264C may latch the internal data ID<1:N> based on a pulse of the fourth input control signal PIN<4>. The fourth pipe circuit 264C may output the latched internal data ID<1:N> to the fourth internal node ND24C based on the pulse of the fourth output control signal POUT<4>. The internal data ID<1:N> loaded on the fourth internal node ND24C may be set as fourth latch data LD4<1:N>.

The data output circuit 265C may be implemented with a first pre-charge device 265_1C, a second pre-charge device 265_2C, a third pre-charge device 265_3C, a fourth pre-charge device 265_4C, and a logic device 265_5C.

The first pre-charge device 265_1C may be implemented with an NMOS transistor disposed between the first internal node ND21C and a ground voltage VSS. The first pre-charge device 265_1C may be turned-on when the first pre-charge signal PCG<1> is input at a logic "high" level to pre-charge the first internal node ND21C to the ground voltage VSS level. The first pre-charge device 265_1C may be turned-off when the first pre-charge signal PCG<1> is input at a logic "low" level.

The second pre-charge device 265_2C may be implemented with an NMOS transistor disposed between the second internal node ND22C and the ground voltage VSS. The second pre-charge device 265_2C may be turned-on when the second pre-charge signal PCG<2> is input at a logic "high" level to pre-charge the second internal node ND22C to the ground voltage VSS level. The second pre-charge device 265_2C may be turned-off when the second pre-charge signal PCG<2> is input at a logic "low" level.

The third pre-charge device 265_3C may be implemented with an NMOS transistor disposed between the third internal node ND23C and the ground voltage VSS. The third pre-charge device 265_3C may be turned-on when the third pre-charge signal PCG<3> is input at a logic "high" level to pre-charge the third internal node ND23C to the ground voltage VSS level. The third pre-charge device 265_3C may be turned-off when the third pre-charge signal PCG<3> is input at a logic "low" level.

The fourth pre-charge device 265_4C may be implemented with an NMOS transistor disposed between the fourth internal node ND24C and the ground voltage VSS. The fourth pre-charge device 265_4C may be turned-on when the fourth pre-charge signal PCG<4> is input at a logic "high" level to pre-charge the fourth internal node ND24C to the ground voltage VSS level. The fourth pre-charge device 265_4C may be turned-off when the fourth pre-charge signal PCG<4> is input at a logic "low" level.

The logic device 265_5C may be implemented with a NOR gate. The logic device 265_5C may generate data DATA<1:N> according to logic levels of the first internal node ND21C, the second internal node ND22C, the third internal node ND23C, and the fourth internal node ND24C. The logic device 265_5C may inversely buffer the first latch data LD1<1:N> loaded on the first internal node ND21C to generate the data DATA<1:N> when the second internal node ND22C, the third internal node ND23C, and the fourth internal node ND24C are pre-charged to the ground voltage VSS level. The logic device 265_5C may inversely buffer the second latch data LD2<1:N> loaded on the second internal node ND22C to generate the data DATA<1:N> when first internal node ND21C, the third internal node ND23C, and the fourth internal node ND24C are pre-charged to the ground voltage VSS level. The logic device 265_5C may inversely buffer the third latch data LD3<1:N> loaded on the third internal node ND23C to generate the data DATA<1:N> when first internal node ND21C, the second internal node ND22C, and the fourth internal node ND24C are pre-charged to the ground voltage VSS level. The logic device 265_5C may inversely buffer the fourth latch data LD4<1:N> loaded on the fourth internal node ND24C to generate the data DATA<1:N> when first internal node ND21C, the second internal node ND22C, and the third internal node ND23C are pre-charged to the ground voltage VSS level.

The electronic system according to an embodiment of the present disclosure pre-charges an unused internal node among internal nodes connected to a plurality of pipe circuits to a power voltage level during a read operation, thereby reducing loading of the internal nodes. The electronic system according to an embodiment of the present disclosure pre-charges the unused internal node among internal nodes connected to a plurality of pipe circuits to a power voltage level during a read operation to load on the internal nodes, thereby outputting data at high speed.

Figure 21:
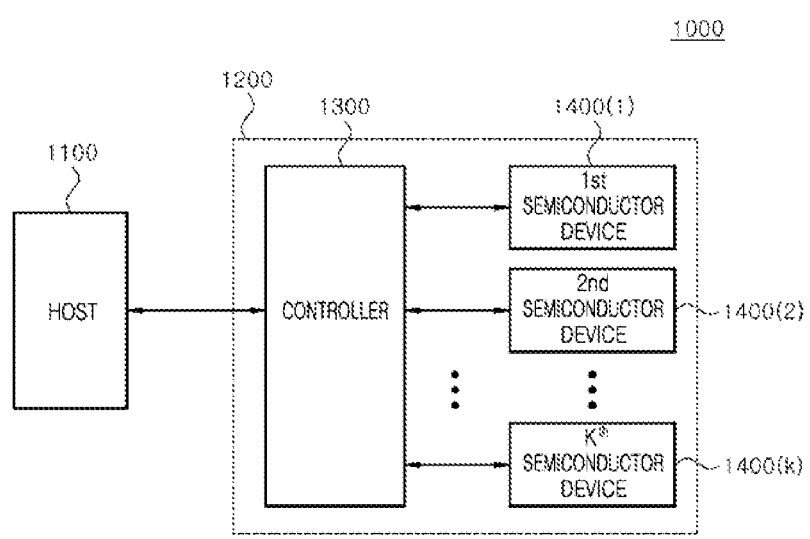
FIG. 21 is a block diagram illustrating a configuration of an electronic system according to another embodiment of the present disclosure.

FIG. 21 is a block diagram illustrating a configuration of an electronic system 1000 according to another embodiment of the present disclosure. As illustrated in FIG. 21, the electronic system 1000 may include a host 1100 and a semiconductor system 1200.

The host 1100 and the semiconductor system 1200 may mutually transmit signals using an interface protocol. The interface protocol used between the host 1100 and the semiconductor system 1200 may include multi-media card (MMC), enhanced small disk interface (ESDI), integrated drive electronics (IDE), peripheral component interconnect-express (PCI-E), advanced technology attachment (ATA), serial ATA (SATA), parallel ATA (PATA), serial attached SCSI (SAS), universal serial bus (USB), or the like.

The semiconductor system 1200 may include a controller 1300 and semiconductor devices 1400(K:1). The controller 1300 may control the semiconductor devices 1400(K:1) to perform read operations. Each of the semiconductor devices 1400(K:1) pre-charges an unused internal node among the internal nodes connected to a plurality of pipe circuits to a power voltage level or a ground voltage level during a read operation, thereby reducing the loading of the internal nodes. Each of the semiconductor devices 1400(K:1) pre-charges the unused internal node among the internal nodes connected to the plurality of pipe circuits to a power voltage level or a ground voltage level during the read operation to reduce the load of the internal nodes, thereby outputting data at high speed.

The controller 1300 may be implemented with the controller 110 illustrated in FIG. 1. Each of the semiconductor devices 1400(K:1) may be implemented with the electronic device 120 illustrated in FIG. 1. According to embodiments, each of the semiconductor devices 1400(K:1) may be implemented with one of dynamic random access memory (DRAM), phase change random access memory (PRAM), resistive random access memory (RRAM), magnetic random access memory (MRAM), and ferroelectric random access memory (FRAM).

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. An electronic device comprising:
a pre-charge control circuit configured to generate first and second pre-charge signals with pulses that are selectively generated based on a first and second output control signals that are generated during a read operation; and
a data processing circuit configured to pre-charge one of first and second internal nodes based on the first and second pre-charge signals, latch internal data based on first and second input control signals, and output data that is generated from the latched internal data to an external device based on the first and second output control signals, the data being generated from the internal data that is transmitted through one of the first and second internal nodes.

2. The electronic device of claim 1,
wherein the pre-charge control circuit is configured to generate the second pre-charge signal from a pulse of the first output control signal and configured to generate the first pre-charge signal from a pulse of the second output control signal.

3. The electronic device of claim 1,
wherein the data processing circuit is configured to pre-charge one of the first and second internal nodes to a power voltage based on the first and second pre-charge signals.

4. The electronic device of claim 1, wherein the data processing circuit includes:
a first pipe circuit configured to latch the internal data based on a pulse of the first input control signal, generate first latch data from the latched internal data based on the first output control signal, and output the first latch data to the first internal node;
a second pipe circuit configured to latch the internal data based on a pulse of the second input control signal, generate second latch data from the latched internal data based on the second output control signal, and output the second latch data to the second internal node; and
a data output circuit configured to pre-charge the first internal node to a power voltage based on the first pre-charge signal, pre-charge the second internal node to the power voltage based on the second pre-charge signal, and generate the data from one of the first latch data and the second latch data that are loaded on the first internal node and the second internal node, respectively.

5. The electronic device of claim 4, wherein the data output circuit includes:
a first pre-charge device configured to be disposed between the power voltage and the first internal node and configured to drive the first internal node to the power voltage based on the first pre-charge signal;
a second pre-charge device configured to be disposed between the power voltage and the second internal node and configured to drive the second internal node to the power voltage based on the second pre-charge signal; and
a logic device configured to generate the data from one of the first latch data and the second latch data that is loaded on the first internal node and the second internal node, respectively.

6. The electronic device of claim 1, wherein the data processing circuit includes:
a first pipe circuit configured to latch the internal data based on a pulse of the first input control signal, generate first latch data from the latched internal data based on the first output control signal, and output the first latch data to the first internal node;
a second pipe circuit configured to latch the internal data based on a pulse of the second input control signal, generate second latch data from the latched internal data based on the second output control signal, and output the second latch data to the second internal node; and
a data output circuit configured to pre-charge the first internal node to a ground voltage based on the first pre-charge signal, pre-charge the second internal node to the ground voltage based on the second pre-charge signal, and generate the data from one of the first latch data and the second latch data that is loaded on the first internal node and the second internal node, respectively.

7. The electronic device of claim 6, wherein the data output circuit includes:
a first pre-charge device configured to be disposed between the first internal node and the ground voltage, and drive the first internal node to the ground voltage based on a pulse of the first pre-charge signal;

a second pre-charge device configured to be disposed between the second internal node and the ground voltage, and drive the second internal node to the ground voltage based on a pulse of the second pre-charge signal; and a logic device configured to generate the data from one of the first latch data and the second latch data that is loaded on the first internal node and the second internal node, respectively.

8. The electronic device of claim 1, further comprising:

a column pulse generation circuit configured to generate a column pulse with a pulse that is generated by decoding a command for performing the read operation in synchronization with a clock;

a shift circuit configured to generate a column shifting pulse by delaying the column pulse by a latency period; and a pipe control circuit configured to generate the first and second input control signals with pulses that are sequentially generated according to the pulse of the column pulse and configured to generate the first and second output control signals with pulses that are sequentially generated according to the pulse of the column shifting pulse.

9. The electronic device of claim 8, wherein the pipe control circuit includes:

an input control circuit configured to generate the first and second input control signals with the pulses that are sequentially generated according to the pulse of the column pulse; and an output control circuit configured to generate the first and second output control signals with the pulses that are sequentially generated according to the pulse of the column shifting pulse.

10. The electronic device of claim 9, wherein the input control circuit includes:

a pre-input signal generation circuit configured to generate first and second pre-input signals that are sequentially generated according to the pulse of the column pulse; and an input control signal generation circuit configured to generate the first and second input control signals from the pulse of the column pulse while the first and second pre-input signals are enabled.

11. The electronic device of claim 9, wherein the output control circuit includes:

a pre-output signal generation circuit configured to generate first and second pre-output signals that are sequentially generated according to the pulse of the column pulse; and an output control signal generation circuit configured to generate the first and second output control signals from the pulse of the column pulse while the first and second pre-output signals are enabled.

12. An electronic device comprising:

a pipe control circuit configured to generate first and second input control signals with pulses that are sequentially generated according to a pulse of a column pulse and configured to generate first and second output control signals with pulses that are sequentially generated according to a pulse of a column shifting pulse;

a pre-charge control circuit configured to generate a first pre-charge signal with a pulse that is generated based on the second output control signal after generating a second pre-charge signal with a pulse that is generated based on the first output control signal; and a data processing circuit configured to pre-charge a second internal node based on a pulse of the second pre-charge signal, pre-charge a first internal node based on a pulse of the first pre-charge signal after generating first data from first internal data based on the first input control signal and the first output control signal, and generate second data from second internal data based on the second input control signal and the second output control signal.

13. The electronic device of claim 12, wherein the pipe control circuit includes:

an input control circuit configured to generate the first and second input control signals with pulses that are sequentially generated according to the pulse of the column pulse; and an output control circuit configured to generate the first and second output control signals with pulses that are sequentially generated according to the pulse of the column shifting pulse.

14. The electronic device of claim 12, wherein the data processing circuit is configured to generate the first data from the first internal data that is output to the first internal node when the second internal node is pre-charged and configured to generate the second data from the second internal data output to the second internal node when the first internal node is pre-charged.

15. The electronic device of claim 12, wherein the data processing circuit includes:

a first pipe circuit configured to latch the first internal data based on a pulse of the first input control signal, generate first latch data from the latched first internal data based on the first output control signal, and output the first latch data to the first internal node;

a second pipe circuit configured to latch the second internal data based on a pulse of the second input control signal, generate second latch data from the latched second internal data based on the second output control signal, and output the second latch data to the second internal node; and a data output circuit configured to pre-charge the second internal node to a power voltage by the second pre-charge signal, pre-charge the first internal node to the power voltage based on the first pre-charge signal after generating the first data from the first latch data that is loaded on the first internal node, and generate the second data from the second latch data that is loaded on the second internal node.

16. The electronic device of claim 15, wherein the data output circuit includes:

a first pre-charge device configured to be disposed between the power voltage and the first internal node, and drive the first internal node to the power voltage based on the first pre-charge signal;

a second pre-charge device configured to be disposed between the power voltage and the second internal node, and drive the second internal node to the power voltage based on the second pre-charge signal; and a logic device configured to generate the first and second data from one of the first latch data and the second latch data that is loaded on the first internal node and the second internal node, respectively.

17. The electronic device of claim 12, wherein the data processing circuit includes:

a first pipe circuit configured to latch the first internal data based on a pulse of the first input control signal, generate first latch data from the latched first internal data based on the first output control signal, and output the first latch data to the first internal node;

a second pipe circuit configured to latch the second internal data based on a pulse of the second input control signal, generate second latch data from the latched second internal data based on the second output control signal, and output the second latch data to the second internal node; and a data output circuit configured to pre-charge the second internal node to a ground voltage based on the second pre-charge signal, pre-charge the first internal node to the ground voltage based on the first pre-charge signal after generating the first data from the first latch data that is loaded on the first internal node, and generate the second data from the second latch data that is loaded on the second internal node.

18. The electronic device of claim 17, wherein the data output circuit includes:

a first pre-charge device configured to be disposed between the first internal node and the ground voltage, and drive the first internal node to the ground voltage based on a pulse of the first pre-charge signal;

a second pre-charge device configured to be disposed between the second internal node and the ground voltage, and drive the second internal node to the ground voltage based on a pulse of the second pre-charge signal; and a logic device configured to generate the first and second data from one of the first latch data and the second latch data that is loaded on the first internal node and the second internal node, respectively.

19. An electronic device comprising:

a pre-charge control circuit configured to generate a plurality of pre-charge signals based on a plurality of output control signals with pulses that are selectively generated during a read operation; and a data processing circuit configured to include a plurality of pipe circuits, pre-charge a plurality of internal nodes connected to the plurality of pipe circuits based on the plurality of pre-charge signals, the plurality of pipe circuits outputting internal data to one of the plurality of internal nodes based on a plurality of input control signals and the plurality of output control signals, and generate data according to logic levels of the plurality of internal nodes to output the generated data to an external device.

20. The electronic device of claim 19, wherein the data processing circuit pre-charges the plurality of internal nodes to a power voltage level based on the plurality of pre-charge signals.

21. The electronic device of claim 19, wherein the data processing circuit pre-charges the plurality of internal nodes to a ground voltage level based on the plurality of pre-charge signals.

* * * * *